US010714671B2

(12) United States Patent
Thuss

(10) Patent No.: US 10,714,671 B2
(45) Date of Patent: Jul. 14, 2020

(54) APPARATUS, AND PROCESS FOR COLD SPRAY DEPOSITION OF THERMOELECTRIC SEMICONDUCTOR AND OTHER POLYCRYSTALLINE MATERIALS AND METHOD FOR MAKING POLYCRYSTALLINE MATERIALS FOR COLD SPRAY DEPOSITION

(71) Applicant: Richard C Thuss, Berryville, VA (US)

(72) Inventor: Richard C Thuss, Berryville, VA (US)

( * ) Notice: Subject to any disclaimer, the term of this patent is extended or adjusted under 35 U.S.C. 154(b) by 0 days.

(21) Appl. No.: 16/399,560

(22) Filed: Apr. 30, 2019

(65) Prior Publication Data

US 2019/0355891 A1 Nov. 21, 2019

Related U.S. Application Data

(60) Provisional application No. 62/673,556, filed on May 18, 2018.

(51) Int. Cl.
*H01L 35/34* (2006.01)
*C23C 24/04* (2006.01)
(Continued)

(52) U.S. Cl.
CPC .............. *H01L 35/34* (2013.01); *C23C 24/04* (2013.01); *H01L 35/14* (2013.01); *H01L 35/16* (2013.01); *H01L 35/28* (2013.01)

(58) Field of Classification Search
CPC ......... H01L 25/04; H01L 35/14; H01L 35/16; H01L 35/28; H01L 35/34; B05B 7/205; C23C 24/04

See application file for complete search history.

(56) References Cited

U.S. PATENT DOCUMENTS 8,187,620 B2 * 5/2012 Chandrasekaran ... A61L 31/146
424/423
2007/0221746 A1 * 9/2007 Heinrich ............... B05B 7/1626
239/135

(Continued)

OTHER PUBLICATIONS

Hyung-jun et al "Fabrication of WC-Co coatings by cold spray deposition" Surface and Coatings Technology, 191 (2005) pp. 335-340. (Year: 2005).*

*Primary Examiner* — Caridad Everhart
(74) *Attorney, Agent, or Firm* — Lytle Patent Services, LLC

(57) ABSTRACT

An apparatus and method perform supersonic cold-spraying to deposit N and P-type thermoelectric semiconductor, and other polycrystalline materials on other materials of varying complex shapes. The process developed has been demonstrated for bismuth and antimony telluride formulations as well as Tetrahedrite type copper sulfosalt materials. Both thick and thin layer thermoelectric semiconductor material is deposited over small or large areas to flat and highly complex shaped surfaces and will therefore help create a far greater application set for thermoelectric generator (TEG) systems. This process when combined with other manufacturing processes allows the total additive manufacturing of complete thermoelectric generator based waste heat recovery systems. The processes also directly apply to both thermoelectric cooler (TEC) systems, thermopile devices, and other polycrystalline functional material applications.

20 Claims, 12 Drawing Sheets

(51) Int. Cl.
    *H01L 35/16*     (2006.01)
    *H01L 35/28*     (2006.01)
    *H01L 35/14*     (2006.01)

(56) References Cited

U.S. PATENT DOCUMENTS

| | | | |
|---|---|---|---|
| 2014/0272171 A1* | 9/2014 | Vogli | C04B 35/62222 427/456 |
| 2019/0224701 A1* | 7/2019 | Burgess | B05B 7/205 |

* cited by examiner

| SAMPLE ID | CUMULATIVE VOLUME % LESS THAN INDICATED SIZE | | |
|---|---|---|---|
| | D[v,0.10](μm) | D[v,0.50](μm) | D[v,0.90](μm) |
| BISMUTH TELLURIDE | | | |
| N-TYPE | 0.62 | 2.23 | 8.33 |
| P-TYPE | 0.62 | 2.56 | 10.99 |

| SAMPLE ID | CUMULATIVE NUMBER % LESS THAN INDICATED SIZE | | |
|---|---|---|---|
| | D[n,0.10](μm) | D[n,0.50](μm) | D[n,0.90](μm) |
| BISMUTH TELLURIDE | | | |
| N-TYPE | 0.19 | 0.37 | 0.77 |
| P-TYPE | 0.18 | 0.35 | 0.72 |

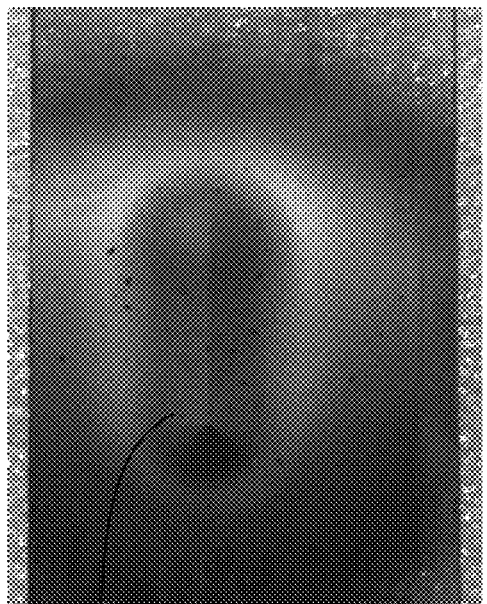
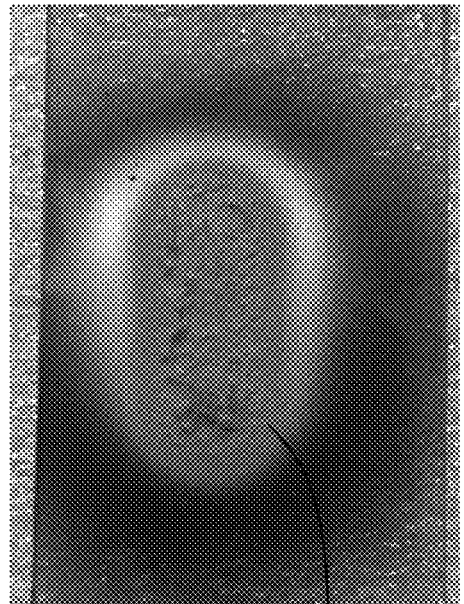
FIG. 9A          FIG. 9B
| CUMULATIVE VOLUME % LESS THAN INDICATED SIZE |||
|---|---|---|
| D[v,0.10](μm) | D[v,0.50](μm) | D[v,0.90](μm) |
| 0.62 | 2.56 | 10.99 |
FIG. 9C
| CUMULATIVE VOLUME % LESS THAN INDICATED SIZE |||
|---|---|---|
| D[v,0.10](μm) | D[v,0.50](μm) | D[v,0.90](μm) |
| 2.5 | 13.3 | 26.7 |
FIG. 9D

APPARATUS, AND PROCESS FOR COLD SPRAY DEPOSITION OF THERMOELECTRIC SEMICONDUCTOR AND OTHER POLYCRYSTALLINE MATERIALS AND METHOD FOR MAKING POLYCRYSTALLINE MATERIALS FOR COLD SPRAY DEPOSITION This present application claims the benefit of the earlier filing date of U.S. Provisional patent application, Ser. No. 62/673,556 filed 18 May 2018, the entire contents of which being incorporated by reference herein in its entirety.

The present application also contains subject matter related to that in U.S. Pat. No. 9,306,146, the entire contents of which is incorporated herein by reference.

BACKGROUND

Waste heat is a significant global environmental issue, but it is one that draws little attention because of very limited solutions. A large fraction of energy used in industrial processes and transportation systems is lost as low grade waste heat, and several trillion dollars of energy generated from fossil fuels in the U.S. each year, equal to nearly sixty quadrillion BTUs, is discarded without benefit in the form of waste heat.

Thermoelectric generators or (TEGs) using solid state conversion of heat to electricity is one technology for application to waste heat recovery, but TEGs are currently only used in niche markets because the resulting cost per kilowatt is high, and they are difficult to integrate into waste heat sources because of their flat plate form factor. TEGs are usually manufactured in small, flat plate modules using small pellets of N-type and P-type crystalline semiconductor materials wired in series or parallel. As recognized by the present inventor, the flat form factor makes the TEGs difficult to thermally couple to complex shaped heat sources and equally difficult to couple to active cooling sources, both issues adding significantly to TEG installation complexity and cost. The present inventor also recognized that TEGs made using semi-conductor pellets also require the use of solders to hold the multilayer thermoelectric couple element assembly together, and these materials often limit potential applications and the maximum electrical output of the devices. The overall design of current commercial thermoelectric devices also make them subject to degradation or failure when subjected to moderate to intense mechanical and thermal shock environments.

Additive manufacturing of TEGs offers the potential to spray or otherwise deposit the N-type and P-type semiconductor materials and all the other material layers required for a functional TEG directly onto complex shaped waste heat or other thermal energy sources. The potential combination of several additive manufacturing processes enable sequentially building up the electrical isolation layer, an adhesion layer, the interconnecting conductive metallic layer or layers, diffusion barrier material layer, and both the N-type and P-type semiconductor layers required for a functional TEG. One potential method of achieving both the deposition of the thermoelectric semiconductor and metallic materials is the use of the supersonic cold-spray deposition process, although the industry has struggled to find a solution that achieves that objective.

"Supersonic cold spray" is a material deposition process that has been developed to build up metallic material layers by impacting micrometer sized metal particles at high velocities onto a substrate. A helium or nitrogen gas stream under pressure is accelerated to supersonic velocity by expansion through a converging-diverging nozzle. The normally spherical metal particles of the material being deposited are inserted into the gas stream either in the converging or diverging sections of the nozzle and then accelerated to high velocity. The normally spherical metal particles in the size range from 10-80 micrometers become entrained within the gas and are directed towards the surface where they deform and knit together on impact forming a strong bond with the surface and with each other. Gas type, gas pressure, gas temperature, nozzle configuration, nozzle extension length, average particle size of the material being sprayed, the particle's drag coefficient, and the particle size distribution must be optimized for each different material. In addition, the feed mechanism and the feed rate of the powdered material into the gas stream must be tailored to the material being sprayed. A unique advantage of the cold-spray process is that the particles are maintained below their melt temperature, and successful deposition depends on the micrometer sized, normally spherical, metal particles deforming on impact. Thus, implementation of the cold spray process has been primarily focused on the use of metallic materials, materials that are malleable and that can be hammered or pressed permanently out of shape without breaking or cracking and particles that can be fused or forged together below their melt temperature. For that reason, the cold-spray process has not been generally applied to the deposition of crystalline or polycrystalline materials, and thermoelectric semiconductors materials and other energy harvesting semiconductor materials. In addition, in the deposition of metals, the metal particle sizes are generally restricted to being greater than ten microns in diameter and normally in the range between 25 microns and 75 microns in diameter since they must exhibit sufficient drag area and mass to be accelerated by the gas stream and gain sufficient momentum to hit the surface with enough force to deform and adhere to the surface and each other before being swept away by the gas stream.

SUMMARY OF THE DISCLOSURE

Using a supersonic cold-spray process, the adhesion to the surface and deposition of near theoretical density layers of both N-type and P-type thermoelectric semiconductor materials and other polycrystalline particles has been achieved by controlling the shapes of the particles in the thermoelectric semiconductor powder material, the maximum particle size and the particle size distribution, incorporating a powder flow and deposition enhancing additive materials, utilizing specifically configured cold spray nozzle and preheated pressurized gas process, and controlling the thermoelectric semiconductor peak particle velocities. Thermoelectric semiconductor powder materials, equipment design, and process parameters have been developed to enable and enhance the cold-spray deposition of thermoelectric semiconductor and other crystalline materials onto metals, glass, ceramic, and high temperature capable polymer surfaces. The powder used in the supersonic cold spray process is controlled to volumetrically have greater than 95% of the particles with a maximum particle size not greater than 15 micrometers and a controlled volumetric particle size distribution over the nominal particle size ranges, from 0.1-6.0 micrometers; 2.0-10.0 micrometers; and 5.0-15 micrometers in major dimension, and by the incorporation of powder flow and deposition enhancing additive materials, such as, but not limited to, hollow glass microspheres, when combined with 1.0-2.0 mm diameter cold spray nozzle throat dimensions, a nozzle throat area to exit area expansion ratios of 6-10, a nozzle divergent/convergent length ratios between 1 and 3, a nitrogen gas process parameters of 450-550 degrees centigrade pre-heat, and gas pressures from 0.4-0.9 million pascal (MPa) yielding gas and particle velocities from 750 to 900 meters/second, an adhesion to the surface and deposition of near theoretical density layers of both N-type and P-type thermoelectric semiconductor materials and other poly crystalline particles has been achieved. Using this process, the semiconductor materials are deposited onto flat as well as complex shaped surfaces in both thin and thick layers, and from individual small pellet sized spots to large continuous areas, thus enabling TEG designs specifically tailored to the application and the heat source. Supersonic cold-spray deposition of thermoelectric materials such as bismuth telluride, antimony telluride, and Tetrahedrite type copper sulfosalts have been demonstrated, and these processes can also apply to functional materials used in other solid state energy harvesting techniques, such as but not limited to piezoelectric devices, thermopiles, as well as for thermoelectric cooling (TECs) devices. Unique powder material composition, particle shape and sizes, and control of the cold-spray process parameters and equipment design allow the uniform cold spray deposition to a surface of polycrystalline materials such as thermoelectric semiconductor materials, and the developed process further enables and enhances the cold spray deposition of crystalline and other non-malleable particles of irregular shapes and dimensions of less than 10 micrometers.

BRIEF DESCRIPTION OF THE DRAWINGS

The images of FIGS. 9A and 9B, and tables in FIGS. 9C and 9D cumulatively demonstrate the effects of particle size and size range variables of thermoelectric semiconductor powders on the supersonic cold spray deposition process. Successful cold spray deposition of thermoelectric semiconductor materials is highly dependent on limiting the maximum particle size and controlling the particle size distribution of the powder material used in the process. Moreover, FIG. 9A is an image of a successful cold spray deposition of P-type bismuth telluride on a glass substrate when using thermoelectric semiconductor powder material with the particle size distribution shown in FIG. 9C and manufactured as described in the current disclosure. FIG. 9B is an image of a cold spray deposition of bismuth telluride on a glass surface when using a particle size distribution shown in FIG. 9D that does not conform to the current disclosure. FIG. 9C is a table of cumulative volume % less than indicated size for both P-type and N-type bismuth telluride thermoelectric semiconductor powders that can be used for successful deposition using the cold-spray processes and equipment design parameters defined within this disclosure. FIG. 9D is a table of cumulative volume % less than indicated size for both P-type and N-type bismuth telluride thermoelectric semiconductor powders that cannot be used successfully in the cold-spray process, as this powder was not prepared within the full constraints of this disclosure.

FIG. 10A is a graph of Seebeck coefficient versus temperature for a P-type cold-sprayed bismuth telluride material created by the processes defined within this disclosure compared to a sample taken from the precursor P-type polycrystalline billet that was used in the generation of the bismuth telluride cold spray powder per the process shown in FIG. 5 as described in the current disclosure. FIG. 10B is a graph of the Seebeck coefficient versus temperature measured at Lawrence Livermore National Laboratory for an N-type cold sprayed bismuth telluride material created by the processes described in this disclosure compared to the precursor polycrystalline billet used in the generation of the bismuth telluride cold spray powder per the process shown in FIG. 5 as described in the current disclosure. FIG. 10C is a graph of the thermal conductivity of a P-type cold sprayed bismuth telluride material created by the processes described within this disclosure compared to the precursor polycrystalline billet used in the generation of the bismuth telluride cold spray powder per the process shown in FIG. 5 as described in the current disclosure.

DETAILED DESCRIPTION

Supersonic cold spray process can be used extensively for the deposition of metallic materials including aluminum, copper, nickel, and many others metals and their alloys.

The process can be used for a variety of applications including metals repair, corrosion control, and the application of hardened surface coatings. Optimization of the final deposited material is achieved by the selection of numerous powder material, equipment, and supersonic cold-spray process parameters.

Figure 1:
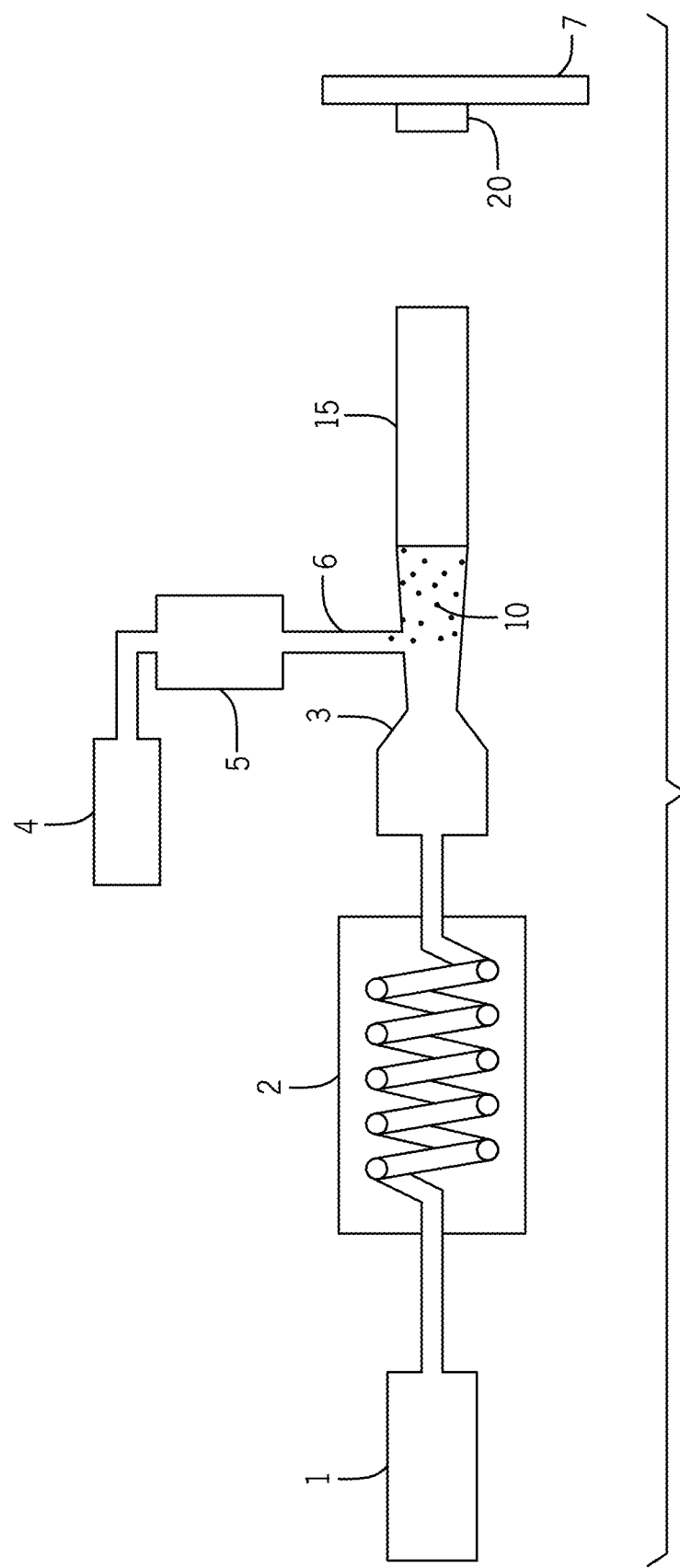
FIG. 1 is a diagram of one apparatus used for cold spray deposition of metallic materials.

FIG. 1 is a high-level diagram of one type of equipment currently used for the cold spray deposition of metallic materials. A gas 1 such as, air, nitrogen or helium is pressurized in the range of from 0.5-3.5 MPa. This pressurized gas 1 is directed into a heater 2 and is heated to 300-550 degrees centigrade. This gas is then directed through a converging-diverging nozzle 3 with a throat diameter between 2.0 millimeter and 2.5 millimeter where the gas 1 is accelerated to supersonic velocity. In this existing version of a cold spray system, a low-pressure gas 4 normally air at atmospheric pressure is fed into a powder feeder 5. The powder feeder 5 contains nearly spherical metal particles 10 in a particle size range from 10-80 micrometers in diameter. The low-pressure gas 4 combines with the nearly spherical particles 10 and carries them through a powder entrance tube 6 inserted into the diverging section of the converging-diverging nozzle 3 where it mixes into the gas 1 that has been accelerated to supersonic velocity. The nearly spherical metal particles 10 accelerated within the supersonic gas flow are directed via 15 a nozzle extension toward a substrate 7 where they are deposited as a coating 20 on impact. Specific nozzle throat area to exit area, convergent-divergent ratios, powder entrance tube diameters and entrance angles are proprietary aspects of each cold spray equipment vendor's design. Despite the variation in nozzle convergent/divergent ratios, as per vendor designs, the present teachings of this disclosure are applicable to the variations. For example, a smaller nozzle throat diameter aids in reducing the gas volumetric flow rate through the nozzle orifice, which is beneficial when spraying smaller sized particles, and an increasing divergent to convergent length ratio tends to increase the peak particle velocity at specific input gas pressure and temperature conditions, which further aids in the transport of smaller particles to the surface.

Figure 2A:
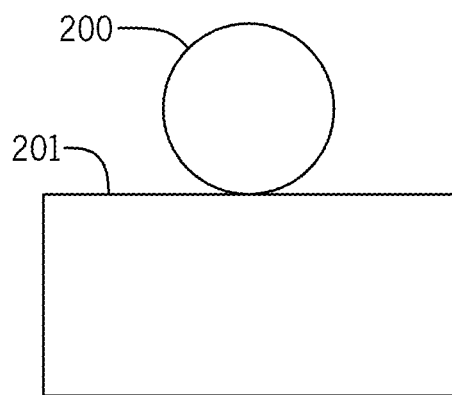
FIG. 2A is a diagram that shows a shape and size of a typical metal supersonic cold-sprayed particle just prior to impacting a metal substrate.

FIG. 2A shows the shape and size of a typical metal particle 200 that has been accelerated to supersonic velocity by the cold spray system shown in FIG. 1 just prior to impacting a metal substrate 201 surface. The typical metal particle 200, is in the size range of 10 to 80 micrometers in diameter and normally constrained to a range from 25-75 micrometers in diameter.

Figure 2B:
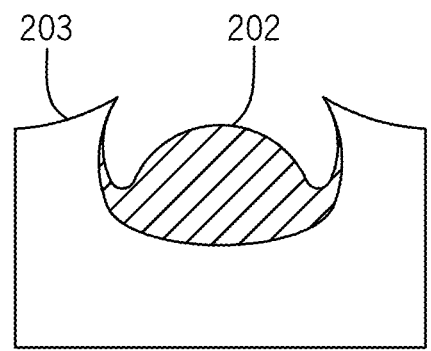
FIG. 2B is a diagram that shows deformation that occurs in both the metal particle and the metal substrate shown in FIG. 2A after the particle has impacted and then adhered to the substrate.

FIG. 2B shows the deformation that occurs to both the typical metal particle 200 and the metal substrate 201 shown in FIG. 2A after the typical metal particle 200 has impacted and adhered to the metal substrate 201. The resulting deformed particle 202 embeds within the deformed substrate 203 and forms a strong bond with the substrate material. The adhesion of the metal particles to the substrate as well as the continued adhesion and buildup of new metal particles to the previously deposited material is accomplished in the solid state, and the successful initial and continued deposition depends on the malleability of the metal particles.

The attributes of the supersonic cold spray process for metals include the low temperature deposition, formation of a dense material structure, and material thermal, structural and electrical properties near or equal to the wrought or cast material. Metal powders with the addition of solid ceramic additives are optionally used to improve the hardness and wear resistance of the final materials where the deforming metal particles encapsulate and hold the non-deforming ceramic additives within the deposited material matrix.

The supersonic cold-spray deposition process used for metals does not directly apply to the cold spray deposition of thermoelectric semiconductors, and more generally to crystalline materials. Crystalline materials are not malleable, and they do not deform when they hit the surface at high velocity. Micron sized particles made from crystalline materials are not usually spherical in shape and uniform in size in all three dimensions.

Figure 3:
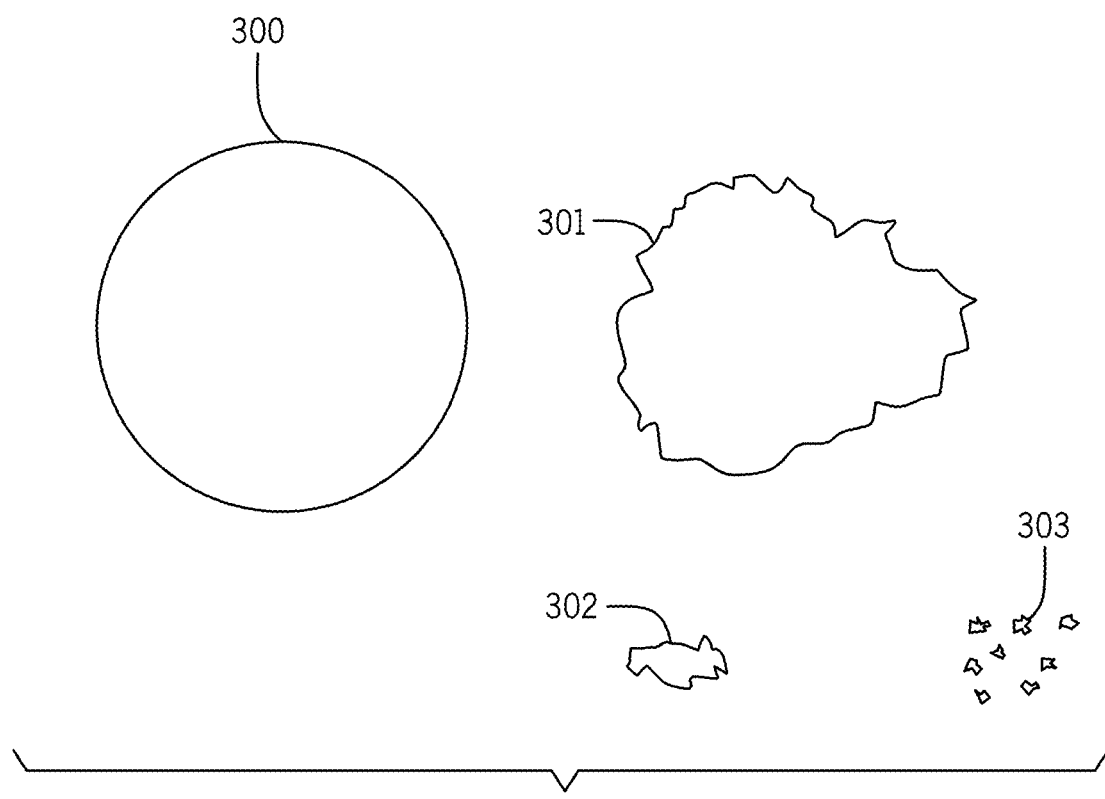
FIG. 3 is a diagram that shows a comparison of the material particle shape and sizes between metal particles which are currently used in the established supersonic cold spray process for metals, and the complex and irregular thermoelectric semiconductor particle shapes and sizes that are created during a mechanical size reduction process of polycrystalline materials such as bismuth and antimony telluride and Tetrahedrite, copper sulfosalt formulations.

FIG. 3 is a comparison of the material particle shape and sizes between metal particles which are used in supersonic cold spray process for metals, and the complex and irregular thermoelectric semiconductor particle shapes and sizes that are created during a mechanical size reduction process of polycrystalline materials such as bismuth and antimony telluride and Tetrahedrite, copper sulfosalt formulations.

In the supersonic cold-spray deposition of metals, a typical spherically shaped metal particle 300 in the diameter range from 25-75 microns in size is used. Particles 301 of crystalline materials in the 25-75 micrometer size range can be made using mechanical sizing processes, but crystalline particles of this maximum size, vary widely in shape and size in all three dimensions. During the size reduction process, the brittle nature of the crystalline material will also produce shard-like, micron sized particles 302 whose sizes vary between 1-6 micrometers in all three dimensions. The size reduction process can also produce extremely small particles 303 whose major and minor dimensions are nanometer in size. Cold spray testing, forming one of the bases for this disclosure, have shown that thermoelectric semiconductor particles 301, of shapes and/or dimensions used in the cold spray deposition of metals do not deform and do not adhere when they impact a surface at supersonic velocity. Crystalline-semiconductor material particles in the 25-75 micrometer size range instead can fracture and bounce off when they impact the surface, essentially sandblasting the surface. Crystalline-semiconductor particles of the size range from 25-75 micrometers when cold sprayed will create craters and fractures in any semiconductor material that has previously deposited as shown in FIG. 9B. Subsequent impacts from particles of this size range eventually scrub away any buildup of semiconductor material that may have previously occurred.

The performance of thermoelectric semiconductor materials, and many other energy harvesting semiconductors, critically depends on maintaining both the crystalline atomic structure and a precise elemental composition including dopant concentration necessary to produce both N-type and P-type materials. Both the atomic structure and the composition characteristics can be negatively compromised if the material is subjected to temperatures or other conditions sufficient to melt the material, change its phase, or alter its composition. For bismuth telluride and antimony telluride formulations, subjecting the materials to temperatures above 580 degrees centigrade, and for Tetrahedrite type materials subjecting the material to temperatures above 650 degrees centigrade can change the elemental composition and crystalline structures sufficient to reduce the Seebeck coefficient, and/or increase the thermal conductivity and the resistivity of the material. If high temperature thermal spray techniques such as plasma spraying, flame spraying, and high velocity oxy-fuel spraying (HVOF) are used for thermoelectric semiconductor materials, the particles melt and those changes to the crystalline structure and/or the elemental composition can significantly reduce or even eliminate the desirable thermoelectric properties. Although supersonic cold-spray technology offers the potential attribute of low temperature deposition, past attempts to directly deposit more than micrometer thick thermoelectric semiconductor, and/or other crystalline powders using the cold spray technique have generally proved unsuccessful, and successful processes for the reliable buildup of uniform, thick layers of material required for applications such as thermoelectric generators has not been achieved.

Particles made from both N-type and P-type polycrystalline semiconductors have many characteristics that have hindered or prevented their effective use in the supersonic cold-spray process. 1) They are usually brittle, and they tend to fracture and disperse rather than deform and adhere when impacting a surface or each other at supersonic velocity. 2) Polycrystalline semiconductor particles of the size range used for metal cold-spray deposition, when they impact the surface, can crater and sand blast away any previously deposited material. 3) Particles made by grinding or milling large polycrystalline billets of material are generally not spherical or regular in shape, with significant variations in the size of all three dimensions and shape irregularities in each dimension. 4) The irregular, shard-like shapes of the crystalline particles have widely varying drag coefficients depending on their orientation within the supersonic gas stream so their rapid and uniform acceleration to supersonic velocities in the gas stream is uncertain. 5) Very low mass particles in the nanometer to low micrometer size range may not gain sufficient kinetic energy to traverse the bow shock of the expanding gas stream and reach the surface. 6) The cohesive and adhesive nature, electrostatic charge, hygroscopicity and non-Newtonian flow characteristics of powders consisting of small, non-spherical, crystalline semiconductor particles, severely inhibit the uniform flow of the powder into the gas stream. 7) The manufacture of powders of thermoelectric semiconductor materials with a maximum particle size and a controlled size range distribution is difficult. 8) The grain size and the orientation of the crystalline structure in the final deposited material are important in determining the final thermoelectric properties.

Consequently, as recognized by the present inventor, the differences in each of these material attributes, and their complex interactions when used in the supersonic cold-spray deposition process, have shown that the successful deposition of thermoelectric semiconductor materials requires a revision to the understanding of the mechanism by which these particles adhere to the surface and to each other. That difference, recognized by the present inventor, drives the need for the significant reduction in the allowable particle sizes and size ranges within the semiconductor material powders down to the very low micrometer to high nanometer size range, and the deposition process requires irregularity in the individual particle shapes.

The combination of particle shape, and particle sizes developed for supersonic cold-spray of metallic materials, will not work for thermoelectric semiconductor and other polycrystalline materials. The current disclosure provides methods, processes and equipment design parameters that enable the cold-spray deposition of thermoelectric semiconductor and other polycrystalline materials to various metallic and non-metallic substrate materials. These disclosed methods and processes when combined with existing manufacturing processes enable the additive manufacturing of complete thermoelectric generator systems that can be used to recover energy from complex shaped waste heat sources used in every economic sector. The methods and processes also enable a significant number of applications for providing power to Internet of Things (IOT) devices.

One of the difficulties associated with supersonic cold spraying thermoelectric semiconductor particles is the high critical angle of repose of the powder and the resulting flow resistance of the irregular shaped particles. The resulting highly cohesive and adhesive nature of 0.10-15 micrometer, highly irregular shaped semiconductor particles create a significant resistance to the uniform flow of the material into the supersonic cold-spray nozzle, and flow enhancement additives such as, but not limited to, hollow glass microspheres can be used to reduce the crystalline powder's resistance to flow.

Figure 4A:
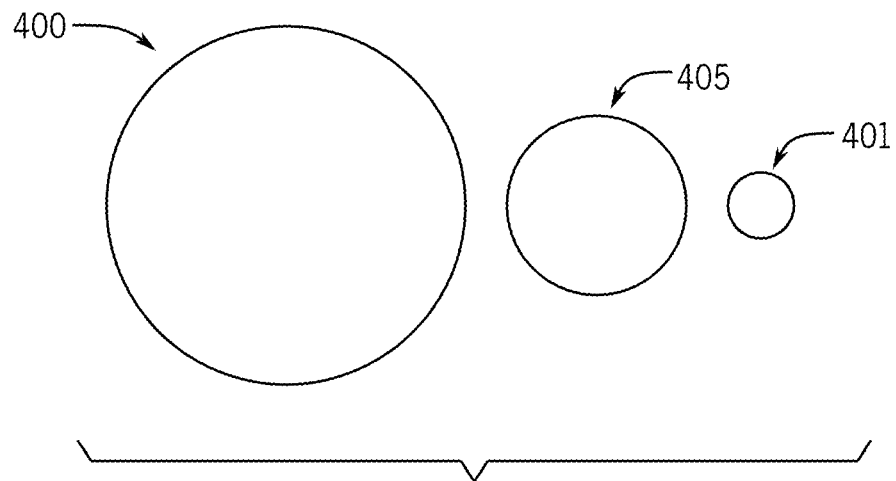
FIG. 4A is a diagram that shows an exemplary range of hollow glass microsphere particles, which can be used as a modifier to facilitate the transport of micrometer and nanometer sized and irregular shaped thermoelectric semiconductor particles into the supersonic gas stream and to the surface of the substrate as described in the current disclosure.

FIG. 4A shows an exemplary range of hollow glass microsphere particles, which can be used as modifiers to facilitate the transport of micrometer and nanometer sized and irregular shaped thermoelectric semiconductor particles into the supersonic gas stream and then to the deposition surface. The hollow glass or other composition microspheres, can vary in particle size from a 100 micrometer in diameter hollow glass or other composition microsphere 400 to a 2 micrometer-diameter hollow glass or another composition microsphere 401. A hollow glass microsphere used as the basis for this disclosure of 18 micrometers in diameter 405 is shown for completion. These hollow glass or other composition microspheres in the size range of 100 micrometers to 2 micrometers are added to the thermoelectric semiconductor powder mix at 5 to 8 weight percent concentrations. In one successful formulation using 3M brand iM30K hollow glass bubbles, these particles are constrained within the size range from 2-37 micrometers in diameter with an average diameter of 18 micrometers, and 30-50 million microsphere particles are incorporated per gram of semiconductor material. These microspheres act to significantly reduce the cohesive nature of the semiconductor powder material and therefore ease the uniform transport of the thermoelectric semiconductor powder material through the powder feed tube and into the cold-spray nozzle.

Figure 4B:
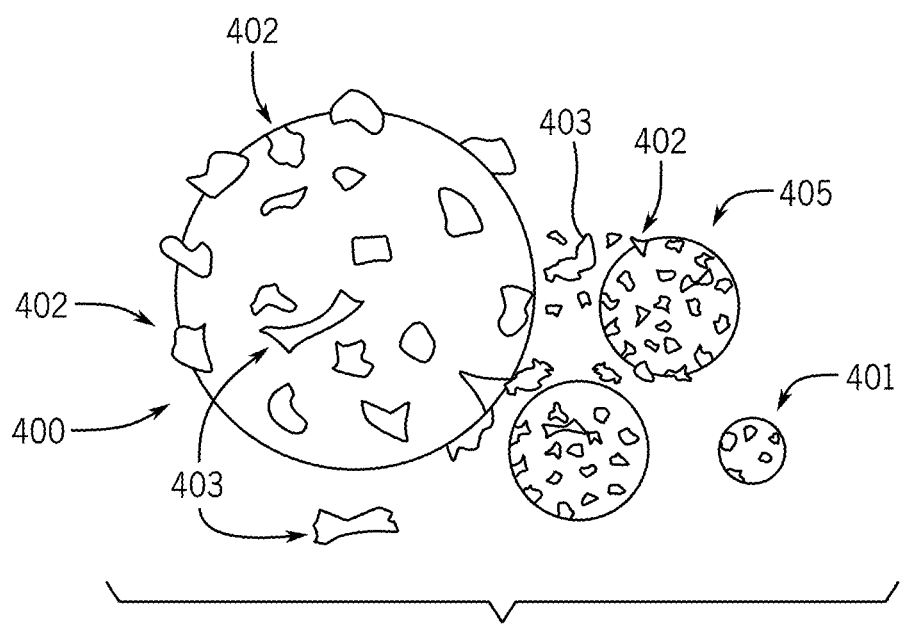
FIG. 4B is a diagram of an example thermoelectric semiconductor powder mix adhering to the hollow glass or other composition microspheres of FIG. 4A to facilitate the cold-spray deposition of these very small, micron to nanometer sized polycrystalline thermoelectric semiconductor materials as described in the current disclosure.

FIG. 4B is an example of the smaller particles created in a thermoelectric semiconductor powder mix adhering to the hollow glass or other composition microspheres of FIG. 4A which facilitates the supersonic cold-spray deposition of these very small, micron to nanometer sized polycrystalline thermoelectric semiconductor materials. Because of Van der wall and other forces, the smaller, less than three to four micrometer sized thermoelectric semiconductor particles 402 are attracted to the surface of the hollow glass or other composition microspheres, varying in size from the 100 micrometer diameter hollow glass or other composition microsphere 400 to the hollow glass or other composition microsphere of a diameter within the particle size range 405 and to the 2 micrometer diameter hollow glass or other composition microsphere 401. Together they create a particle with sufficient mass and drag coefficient to transit the cold-spray supersonic bow shock and impact the surface thus aiding in the deposition of the nanometer to small micrometer sized thermoelectric semiconductor particles that are adhering to the hollow glass or other composition microspheres of FIG. 4A onto the deposition surface and onto previously deposited semiconductor material. The hollow microspheres also help in the transport of irregular shaped, 3-5 micron sized, thermoelectric semiconductor particles 403 to the deposition surface due to mechanical and attractive forces between the thermoelectric semiconductor particles. Cold spray testing and scanning electron microscopy of cold sprayed thermoelectric semiconductor materials performed at Lawrence Livermore National Laboratory has shown that these hollow glass microspheres do impact the surface, but they are not incorporated into the deposited thermoelectric material and therefore do not change the thermoelectric properties of the deposited material.

Figures 8A, 8B, 8C:
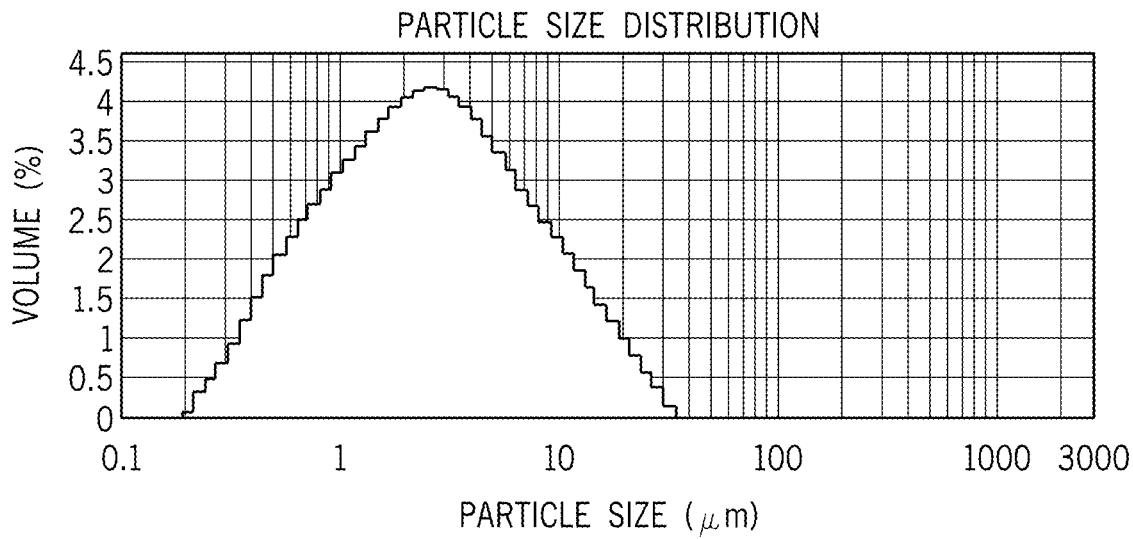
FIG. 8A is a graph of a volumetric particle size distribution of P-type bismuth telluride particles that can be successfully cold-sprayed using the processes and equipment design parameters defined within this disclosure.
FIG. 8B is a table of cumulative volume % less than indicated size for both P-type and N-type bismuth telluride thermoelectric semiconductor powders that can be used for successful deposition using the cold-spray processes and equipment design parameters defined within this disclosure.
FIG. 8C is a table of the cumulative number % less than indicated size for both P-type and N-type bismuth telluride thermoelectric semiconductor powders that can be used for successful deposition using the cold-spray processes and equipment design parameters defined within this disclosure.

Testing forming the basis for this disclosure show that successful supersonic cold-spray deposition of thermoelectric semiconductor materials therefore requires a process where a controlled range of much smaller and irregular shaped particles than are used for metal cold spray applications are created. These particles are generally less than 10 micrometers in maximum equivalent spherical dimension and with specific particle size distributions down to the submicron scale, examples of which are shown in FIGS. 8A, 8B and 8C. The particles are then accelerated to supersonic velocity in the range from 750-950 meters per second and delivered to a chemically etched or mechanically roughened surface. These small, highly irregular shaped particles do not plastically deform on impact, and instead the larger and smaller particles mechanically entangle and knit together at impact to form a dense, very small grain sized material. Cold spray deposition of thermoelectric semiconductor materials depends on a small percentage of the larger sized, irregularly shaped, particles having sufficient energy to wedge or lock into the surface at impact without fracturing where they form a framework where the lower impact energy, smaller, low micrometer to nanometer sized particles can interlock together. Subsequent impacts of the larger and smaller particles then continue to build up and compact the deposited material to near theoretical density.

Supersonic cold-spray deposition of bismuth telluride and other thermoelectric semiconductors require that the powder materials have only a very small percentage of the particles with a maximum equivalent spherical size greater than 10 micrometers and a controlled particle size distribution from 0.1 micrometers to 10 micrometers. The semiconductor material powders need to be created using a process that does not cause compositional or phase changes within the thermoelectric semi-conductor materials. One that limits surface oxidation, limits the particle's major dimension to below approximately ten micrometers, one that creates a controlled particle size range that is tailored to the cold-spray system operating parameters, and one that can be applied to both N-type and P-type semiconductor materials that utilize very small quantities of dopants to create their beneficial thermoelectric properties.

Figure 5:
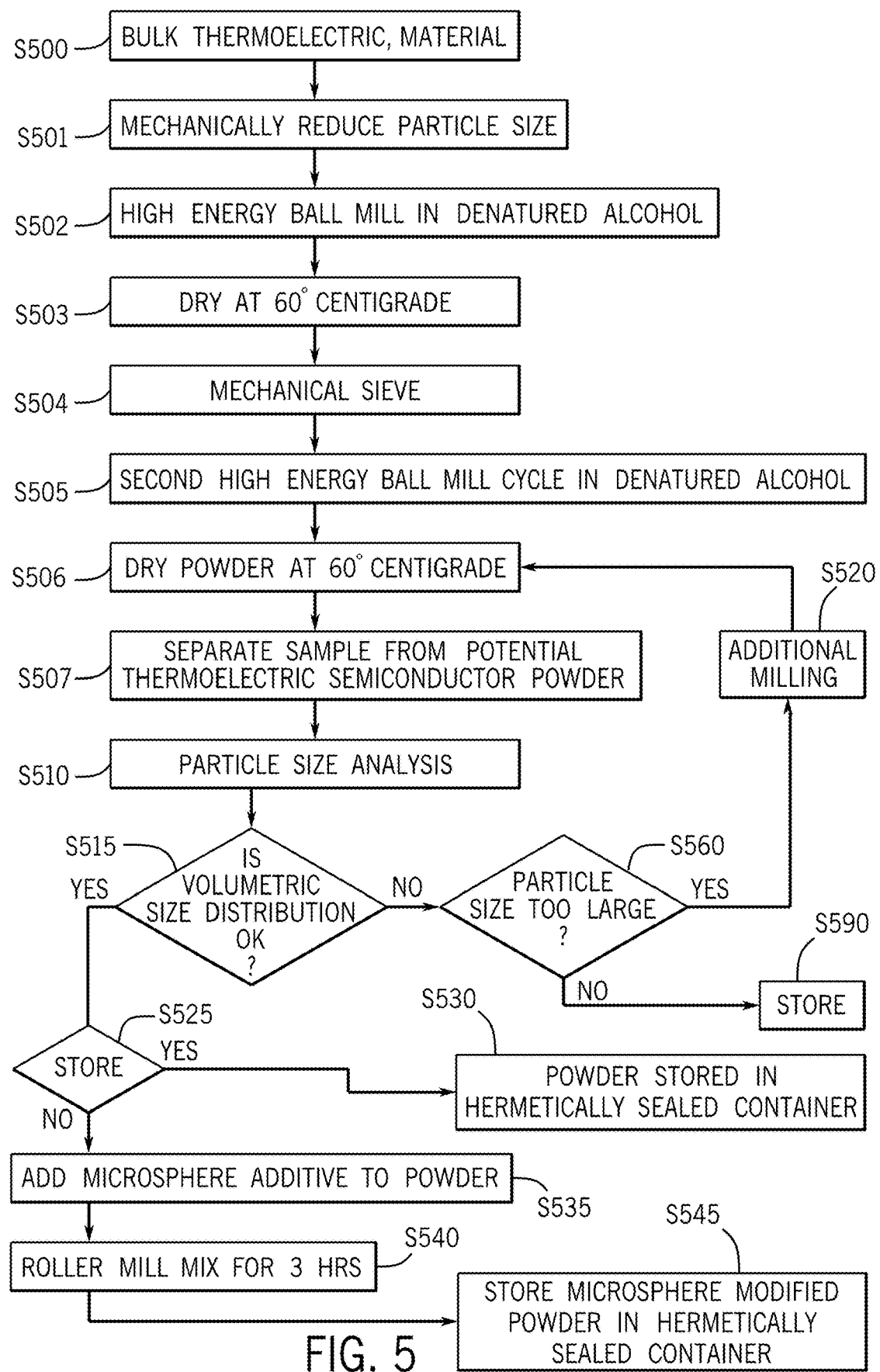
FIG. 5 is a flowchart of a process used to produce a thermoelectric semiconductor powder that can be successfully deposited using the supersonic cold spray process as described in the current disclosure.

FIG. 5 is a flowchart of a process used to produce a thermoelectric semiconductor powder that can be successfully deposited using the supersonic cold-spray process.

The process begins at Step 500 where crystalline materials not limited to but including bulk thermoelectric material billets of bismuth telluride, antimony telluride or Tetrahedrite type formulations are procured or directly fabricated from the elements using established thermal or mechanically induced crystal growth processes. In addition, naturally occurring, Tetrahedrite bearing rocks from the tailings of copper mines have been successfully used. Then the process proceeds to Step 501 where these materials are mechanically reduced to small chunks or nuggets below an approximately #4 standard mesh in size. Then the process proceeds to Step 502 where the resulting material is then high energy mechanically ball milled. Successful high energy mechanical ball milling in Step 502 includes but is not limited to ball milling the Step 501 material in 100 milliliter (ml) alumina vessels using an Across International Planetary Ball Mill. Twenty, 10 mm diameter and thirty, 6 mm diameter alumina balls are added together with 50 grams of thermoelectric semiconductor fabricated per Step 501. Ten ml of denatured alcohol is then added to the alumina vessel before sealing and then planetary ball milling the mixture at 600 RPM for a total of three hours and reversing the direction of the mill every thirty minutes during that three-hour period. The process proceeds to Step 503 where the resultant material is then dried at 60 degrees centigrade, removed from the vessel and separated from the milling balls yielding a dried powder material. The process proceeds to Step 504 where the dried powder material is then sieved through a standard #400 mesh sieve. The powder material that has passed through the sieve in step 504 proceeds to Step 505 where this powder material is subjected to a second three hour long high-energy-ball-milling cycle that reverses direction every thirty minutes as described in Step 502 using an Across International Planetary Ball Mill with fifty grams of the sieved material added to the 100 ml alumina vessel along with 20, 10 mm diameter and thirty, 6 mm diameter alumina balls and 10 ml of denatured alcohol to further reduce the maximum particle size. The process proceeds to Step 506 where the further reduced maximum particle size powder material yielded from Step 505 is then dried at 60 degrees centigrade, and then removed from the vessel and separated from the milling balls, yielding a potential thermoelectric semiconductor powder with a desired volumetric particle size distribution The process proceeds to Step 507 where a sample size of the potential thermoelectric semiconductor powder is removed from the potential thermoelectric semiconductor powder for analysis.

The process proceeds to Step 510 where the sample size of the potential thermoelectric semiconductor powder is submitted for particle size analysis.

Volumetric particle size distribution and physical particle size analysis testing using a Malvern MasterSizer 2000 laser diffraction system with a dry dispersion technique forming the basis for this disclosure has demonstrated that a specific volumetric particle size distribution is required for the successful supersonic cold-spray of thermoelectric semiconductor materials such as but not limited to bismuth telluride, antimony telluride and Tetrahedrite type materials. If the powder has a significant volumetric percentage of equivalent spherical particles greater than approximately 15 micrometers, then during the supersonic cold-spray process the larger crystalline particles will sandblast the surface instead of adhering. Conversely, if the powder is composed only of particles less than 5-6 micrometers in equivalent spherical diameter, then limited to no deposition will occur. The details of this optimum particle size distribution forming the basis for this disclosure for bismuth telluride, antimony telluride and Tetrahedrite formulations is not limited to but includes the measured distributions shown in FIGS. 8A, 8B, and 8C.

The process proceeds to Step 515 where a determination is made if the particles measured in Step 510 show that the volumetric particle size distribution is within the desired range. If the volumetric particle size distribution is not within the desired range, then the process proceeds to Step 560 where a determination is made if the physical particle sizes are too large. If the physical particle sizes are too large the process proceeds to Step 520 where an additional high energy milling cycle occurs. The duration and intensity of this additional high energy milling cycle is based on the crystalline material type and sizing data measured in Step 510. Higher energy ball milling systems, or larger size ball milling vessels require adjustment to the total milling time of Step 502 and Step 505 to achieve the optimum particle size distribution. To develop the optimum particle size distribution for other types crystalline materials requires total milling time of Step 502 and Step 505 being adjusted to account for the material hardness and the crystalline structure, and may require an additional milling cycle.

Testing using bismuth telluride, antimony telluride and natural Tetrahedrite bearing rocks has shown that the double ball milling process as described in Step 502 through Step 506 will produce a powder that can be successfully deposited using the supersonic cold-spray process.

If the determination made in Step 560 that the physical particles are too small, the process proceeds to Step 590 and the potential thermoelectric semiconductor powder is stored until it can be reprocessed for potential recovery and reuse.

If it is determined in Step 515 that the volumetric particle size distribution is within the desired range, then the potential thermoelectric semiconductor material is identified as an acceptable thermoelectric semiconductor powder for the cold-spray process. Although the acceptable thermoelectric semiconductor powder can be successfully cold sprayed as is, it is important to note that the highly cohesive nature of the acceptable thermoelectric semiconductor powder inhibits the transport of the powder into the supersonic cold-spray nozzle shown in FIG. 7 and can also result in clogging of the brass inlet tube 609 shown in FIG. 7. To improve the powder flow characteristics, hollow glass or other composition microspheres as described in FIG. 4 can be added to the powder prior to storage or prior to cold spraying.

The process proceeds to Step 525 and a determination is made regarding whether the acceptable thermoelectric semiconductor powder will be stored as is or if it will be stored with the addition of hollow glass or other composition microspheres.

If it is determined in Step 525 that the acceptable thermoelectric semiconductor powder should be stored without the addition of hollow glass or other composition microspheres, then the process proceeds to Step 530 where the acceptable thermoelectric semiconductor powder is stored in hermetically sealed containers for later use in the process described in FIG. 6.

If it is determined in Step 525 that the acceptable thermoelectric semiconductor powder should be stored with the addition of hollow glass or other composition microspheres, then the process proceeds to Step 535 where the addition of hollow glass or other composition microspheres are added to the acceptable thermoelectric semiconductor powder. The microsphere addition process used for bismuth telluride, antimony telluride and Tetrahedrite type semiconductor powders forming the basis of this disclosure used 3M brand iM30K hollow glass microspheres added in the 5 to 8.2 weight percent range during Step 535 of this process. The process proceeds to Step 540 where the powder mix yield of Step 535 is roller-mill mixed for three hours. The process proceeds to Step 545 where the resultant powder mix of Step 540 is stored in hermetically sealed containers for later use in the process described in FIG. 6. This hollow glass microsphere additive significantly improves the ease of powder transport into the cold-spray nozzle, and it also improves the reliability and uniformity of the deposition by allowing a more controlled particle injection rate into the supersonic gas stream. This is especially important when using vibratory feed systems for the powder.

Figure 6:
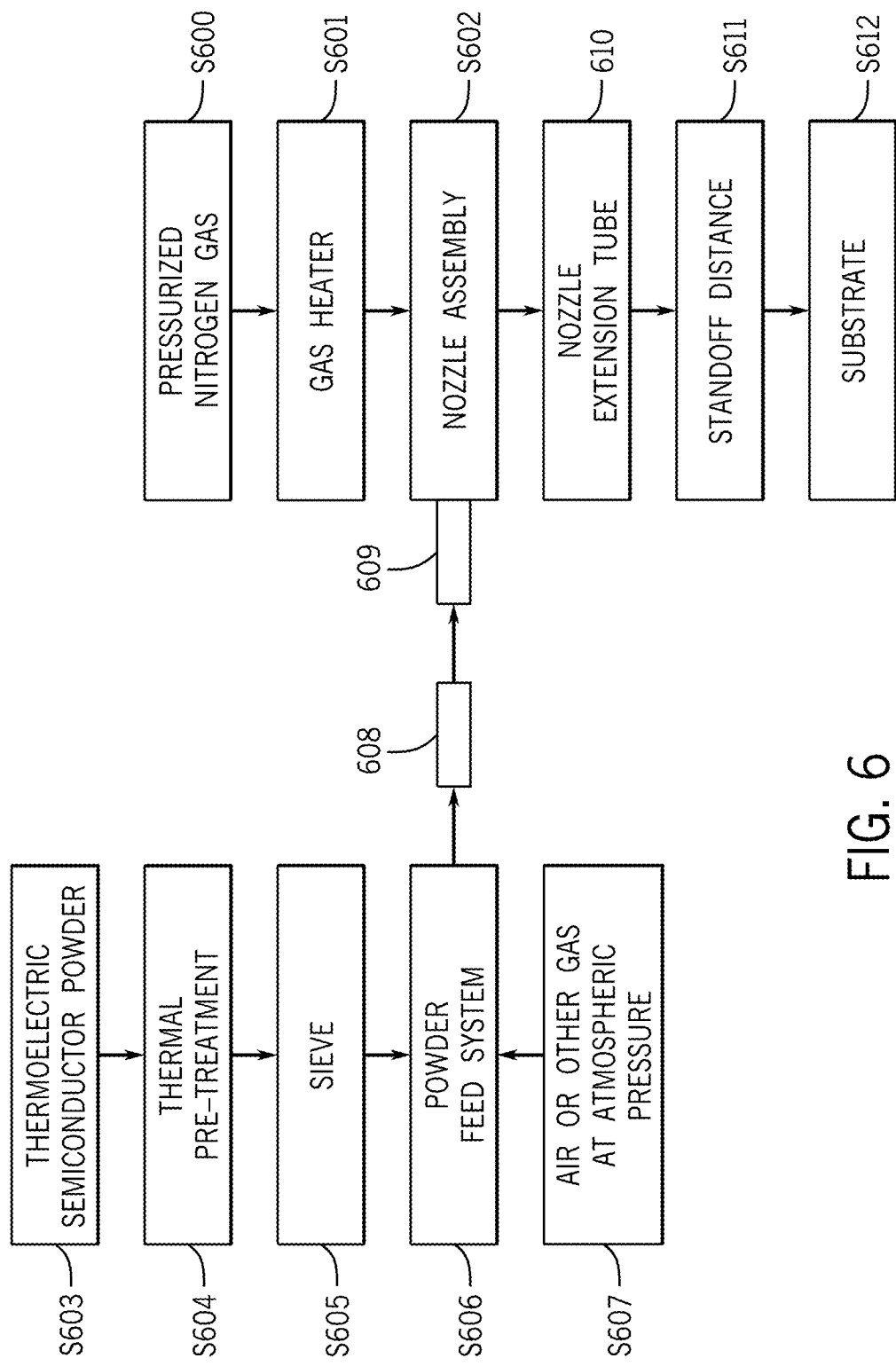
FIG. 6 is a flowchart of elements of an overall supersonic cold spray process and supersonic cold-spray system design parameters developed for thermoelectric semiconductor and other crystalline materials as described in the current disclosure.

FIG. 6 is a flowchart of steps in an overall supersonic cold spray process and system design parameters developed for thermoelectric semiconductor and other crystalline materials as described in the current disclosure.

The process has been developed using nitrogen gas, but it is expected that helium, and mixtures of helium and nitrogen gas can be used, and for specific applications the use of argon or compressed air might be desirable. In the process forming the basis for this disclosure developed for bismuth telluride, antimony telluride, and Tetrahedrite type thermoelectric semiconductors, the process begins at Step 600 where nitrogen gas is pressurized to 0.5-0.9 MPa. The process proceeds to Step 601 where the gas from Step 600 is directed into a gas heater where it is heated to 475-550 degrees centigrade. Using Bismuth telluride or antimony telluride thermoelectric semiconductor materials the optimum gas pressure is approximately 0.70 MPa, and the optimum gas temperature entering the convergent section of the nozzle is 500 degrees centigrade. The process proceeds to Step 602 where the heated gas from Step 601 is then fed into a de Laval type converging-diverging nozzle with a throat diameter between 1-2 mm diameter, exit area to throat area expansion ratio of between 6-10, a divergence to convergence length ratio of 3 to 1 with a divergence full cone angle of 12 degrees, and powder injection tube diameter of 1.5 mm and injection angle of 57 degrees. The nozzle assembly design producing the best results for supersonic cold spray of bismuth telluride and antimony telluride materials occurred when using the gas conditions stated above with a converging-diverging nozzle with throat diameter of 1.5 mm, a convergence-divergence length ratio of 1 to 3, a total divergence full cone angle of twelve degrees, and an exit area to throat area expansion ratio of 10. At the stated conditions, the peak nitrogen gas velocity is approximately 850 meters/sec. This high velocity gas flow creates a suction at the 609 1.5 mm diameter powder inlet tube injection location.

Step 603 is a repository for the thermoelectric semiconductor powder fabricated in Step 530 of FIG. 5 or the thermoelectric semiconductor powder fabricated in Step 545 of FIG. 5. The process proceeds to Step 604 where the powder held in the repository of Step 603 is thermally treated at 60 degrees centigrade for fifteen minutes. The process proceeds to Step 605 where the heated powder of Step 604 is sieved through an #80 mesh sieve to break up large agglomerations that may have formed in the powder prior to proceeding to the next step. The process proceeds to Step 606 where the sieved powder of Step 605 is loaded into a powder feed system. In Step 607, an air or other gas such as nitrogen or argon source is fed into the powder feed system of Step 606 at atmospheric pressure. The outlet of the powder feed system is connected to a flexible three mm ID silicone rubber tube 608 which is connected to a 1.5 mm ID brass inlet tube 609 that is mounted to the nozzle assembly of Step 602. The brass inlet tube 609 outlets into the 1.5 mm diameter powder inlet port located toward the end of the diverging section of the nozzle. Thermoelectric semiconductor powders developed as shown in FIG. 5 that are loaded into the powder feed system Step 606 still retain a high degree of cohesiveness and therefore maintain a high angle of repose, and resistance to flow. Various powder feed system types have been used to successfully transfer the powder into the nozzle assembly including but not limited to a repetitive pulse feed technique where small quantities in the order of 0.1-1.0 grams of the powder are intermittently sucked into the nozzle by repetitive opening and closing the port to the 608, silicone rubber tube. Vibratory feed systems, fluidized bed feed systems, and pressure feed systems currently used in many commercial cold spray systems for metal deposition are not effective in aiding the transport of highly cohesive thermoelectric semiconductor or other polycrystalline powders into the 608 tubing. In another embodiment, successful transport of the cohesive powder into the nozzle system has been demonstrated using ultrasonic vibration of the powder in Step 606 to facilitate powder transport into the 608, silicone rubber tube by restricting the flow of the powder produced in Step 605 into the Step 606 powder feed system. Powder from Step 605 fed into an ultrasonic Step 606 powder feed system at feed rates of 1-4 grams per second has yielded successful deposition of bismuth Telluride and antimony telluride powders. Mixing of the powder in Step 606 into a slurry using denatured alcohol and letting the suction created by the nozzle draw the slurry through the 608, silicone rubber tube into the nozzle is another embodiment that has been used successfully for bismuth telluride and antimony telluride formulations.

The outlet of the divergent section of the nozzle assembly of Step 602 is connected to a nozzle extension tube 610 with an inside diameter which maintains the throat area to exit area of the converging-diverging nozzle. For the nozzle used as the basis of this disclosure, the extension tube had a 5 mm inside diameter. The extension tube allows the particles of the semiconductor powder to be mixed into and accelerated to supersonic velocity by the expanded gas stream, and the tube directs the gas and powder mix toward the surface of the substrate. Analysis performed at Lawrence Livermore National Laboratory has shown that the nanometer to micrometer sized powder material particles rapidly accelerate to supersonic velocity within 5-6 centimeters after they enter the diverging section of the nozzle assembly of Step 602.

Successful supersonic cold-spray depositions of bismuth and antimony telluride formulations have been made with straight extension tubes of lengths from 5 to 20 centimeters, and with a 36 centimeters long coiled extension tube. The best results were achieved using an extension tube length of 10.5 cm. Testing forming the basis of this disclosure has also shown that the shape of the deposited thermoelectric material can be controlled by changing the shape of the extension tube exit while maintaining the desired exit tube area. Successful deposition of an elongated, non-circular section of P-type bismuth telluride material occurred when using an extension tube with an oblong shaped outlet of 2.5 mm wide by 8 mm long thus maintaining the desired nozzle throat area to exit area ratio.

In Step 611 the end of the extension tube is maintained a specific distance from a substrate surface where the thermoelectric semiconductor material is to be deposited. Testing using the powder preparation and the supersonic cold spray system design and operating parameters forming the basis for this disclosure has shown that little variation in the thickness of the deposited material occurs when using standoff distances from 0.65 centimeters to 1.9 centimeters. The optimum step 611 standoff distance using bismuth telluride and antimony telluride materials is 1.3-1.6 centimeter from the substrate surface. The process then proceeds to Step 612 where the supersonic gas stream with the entrained particles is then directed toward the substrate material which can include but is not limited to metallic materials such as aluminum, copper, stainless steel, and nickel; Ceramic materials such as alumina, aluminum silicate; borosilicate glass and quartz; syntactic silicone resin foams, and other semiconductors and semi-metal materials. By varying the composition of the thermoelectric semiconductor powder being sprayed, layered thermoelectric materials can be fabricated that optimize the performance of the thermoelectric generator being fabricated. Using 3D robotic positioning technology, this additive manufacturing process for the supersonic cold-spray deposition of thermoelectric semiconductor materials described in this disclosure can be combined with existing metal supersonic cold-spray technology to fabricate complete thermoelectric generator devices on complex shaped waste heat sources.

Figure 7:
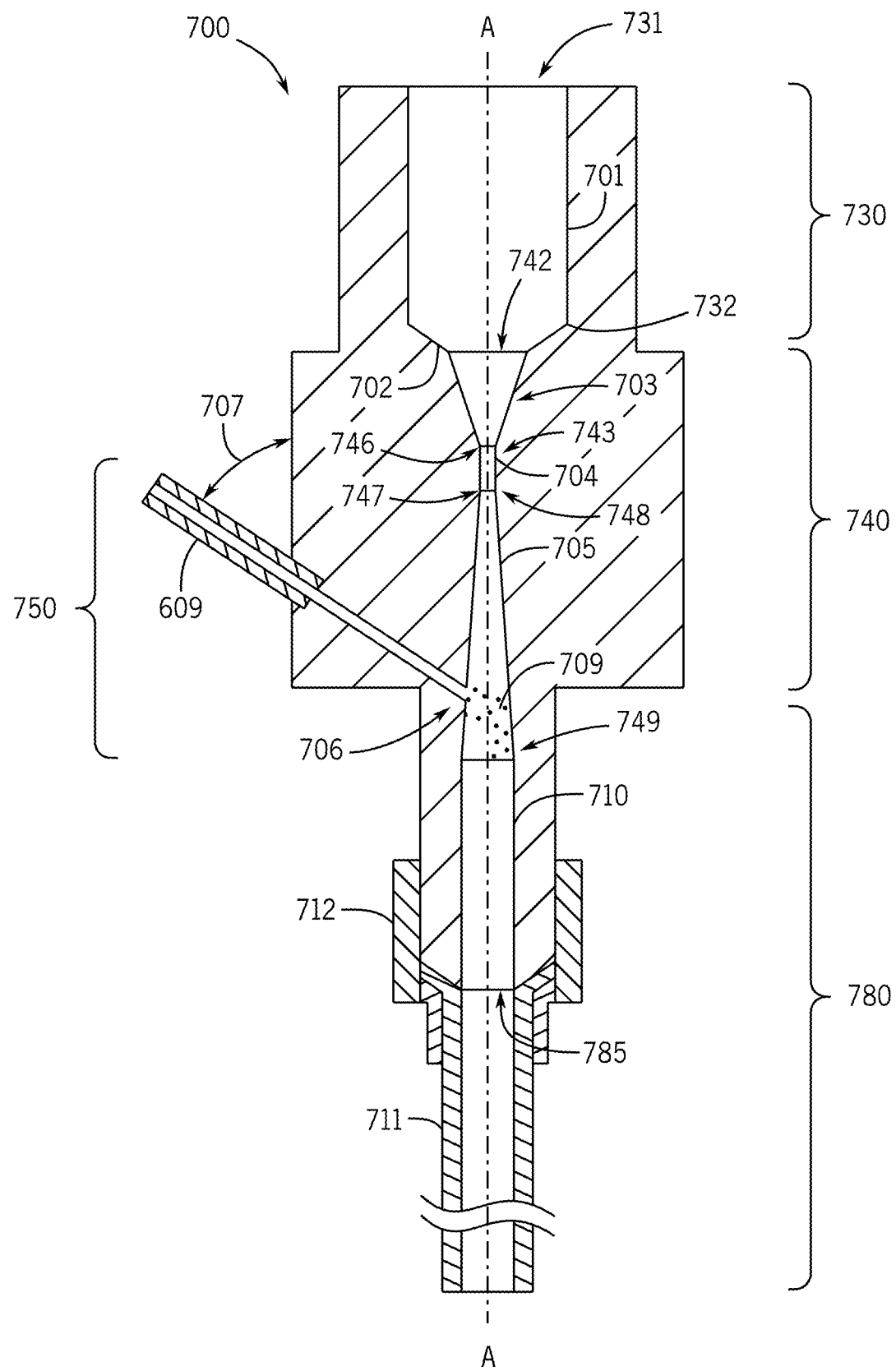
FIG. 7 is a diagram of a supersonic cold spray nozzle design that can be successfully used for the cold-spray deposition of thermoelectric semiconductors and other crystalline materials as described in the current disclosure.

FIG. 7 is a cross section of the nozzle assembly of FIG. 6 Step 602 which has been used for the successful deposition of bismuth telluride, antimony telluride and Tetrahedrite P-type and N-type thermoelectric semiconductor and other crystalline type materials. While this supersonic cold spray nozzle design has similarities to nozzles currently in use for the supersonic cold-spray deposition of metallic materials, there are several unique differences that contribute to the ability to cold spray near theoretical density thermoelectric semiconductor materials as claimed in this disclosure. A cross section of a modified machined brass de Laval type convergent-divergent nozzle assembly 700 comprising a gas feeder section 730, a convergent-divergent section 740, a powder entry section 750, the brass tube 609, and an exit section 780. The gas feeder section 730 comprising a first uniform area 701 having a top side 731 and an opposing side 732 being 11 millimeters in internal diameter and 4.1 centimeters in length and a first sharply tapered area 702. The first sharply tapered area 702 extends from the opposing side 732 of the first uniform area 701 and then being sharply tapered at an angle of 60 degrees from a center axis of the convergent-divergent nozzle assembly 700 to a 5 mm diameter where it transitions into a top side of the convergent portion 703 of the convergent-divergent section 740. The convergent-divergent section 740 comprising a convergent portion 703, a throat section, 704, and a divergent section 705. The convergent portion 703 consists of a top side 742, an opposing side 743. The top side 742 of the convergent portion 703 is immediately tapered at a total angle of 22 degrees for 9 mm to the opposing side 743 of the convergent portion 703. The opposing side 743 transitions to a top portion 746 of the throat section 704. The throat section 704 being 1.5 mm in diameter and extending to 3 mm in length to an opposing side 747 of the throat section 704 transitions to a top side 748 of the divergent section 705. The divergent section 705 is machined at a total cone angle of 12 degrees from the center axis for 18.3 mm in length to an opposing side 749 to achieve a throat area to exit area ratio of 10. The powder entry section 750 comprising a powder entry hole 706 and the brass inlet tube 609 as discussed in FIG. 6. The powder entry hole 706 being 1.5 mm in diameter intersects the divergent section 705 of the nozzle at angle of 57 degrees 707 from the central axis and 14.3 mm from the opposing side 747 of the throat section 704. The brass inlet tube 609 being of an internal diameter of 1.5 mm and being of an external diameter of 3 mm.

The powder feed system of FIG. 6, S606, attaches to the de Laval type convergent-divergent nozzle assembly 700 by inserting the silicone rubber tube 608 onto the brass inlet tube 609. The exit section 780 comprising a constant 5 mm internal diameter section being 1.4 cm in length 710, a stainless-steel extension tube 711, and an AN4 type compression fitting 712. The constant 5 mm internal diameter section being 1.4 cm in length 710 extends from the opposing side 749 of the divergent section 705 to a top side 785 of the stainless-steel extension tube 711. The stainless-steel extension tube 711 being of an ¼ inch external diameter and being of an internal diameter of 5 mm and being a nominal length of 10.5 cm. The AN4 type compression fitting 712 attaches and detaches the stainless-steel extension tube to the modified machined brass de Laval type convergent-divergent nozzle assembly 700.

Nitrogen gas at a nominal pressure of 0.7 MPa and temperature of 500 degrees centigrade enters the modified machined brass de Laval type convergent-divergent nozzle assembly 700 at the top side 731 of the first uniform area 701 of the gas feeder section 730. The thermoelectric semiconductor particles fabricated as described in FIG. 5 and FIG. 6 are drawn into the powder entry section 750 from the silicone rubber tube 608 into the brass inlet tube 609 as suction is created at the powder entry hole 706. The moderate pressure, high temperature gas in the gas feeder section 730 rapidly expands and cools in the divergent section 705 of the convergent-divergent section 740 of the modified machined brass de Laval type convergent-divergent nozzle assembly 700. This gas flow creates suction at the powder entry hole 706 which pulls the 709 thermoelectric semiconductor powder particles from the brass inlet tube 609 into the supersonic gas stream. The gas and rapidly accelerating entrained particles then continue through the exit section 780, first entering the constant 5 mm diameter section 710 and then enter the stainless-steel extension tube 711 prior to being deposited onto a substrate material as described in FIG. 6.

Aspects of this supersonic cold spray nozzle design which aid in the deposition of near theoretical density thermoelectric semiconductor materials with particle sizes in the 0.1-10 µm range as shown in FIG. 8A, are the throat section being 1.5 mm in diameter, the convergence/divergence length ratio of 1 to 3, a nozzle expansion area ratio of 10, the divergent section total cone angle of 12 degrees from the center axis, the powder entry hole being 1.5 mm in diameter, intersecting the divergent section of the nozzle at an angle of 57 degrees from the central axis, and being 14.3 mm from the opposing side of the throat section.

FIG. 8A is a graph of a volumetric particle size distribution of P-type bismuth telluride particles that have been and can be successfully cold-sprayed using the processes and equipment design parameters defined within this disclosure. The particle size distribution was generated using a Malvern MasterSizer 2000 laser diffraction system with a dry dispersion technique with bismuth telluride powders fabricated per the process defined in FIG. 5. Although the laser diffraction measurement technique does not fully account for the non-spherical aspect of the crystalline particles, it has been shown to be effective in defining an acceptable volumetric size range distribution of the particles, which can be cold-sprayed.

FIG. 8B is a table of cumulative volume % less than indicated particle size for both P-type and N-type bismuth telluride thermoelectric semiconductor powders that can be used for successful deposition using the cold-spray process of this disclosure. FIG. 8B shows the cumulative volume % less than indicated size where volumetrically 10% of both the N-type and the P-type particles have an equivalent spherical diameter of less than 0.62 µm; that volumetrically 50% of the N-type and P-type particles have as measured equivalent-spherical-diameters less than 2.23 µm for the N-type and 2.56 µm for the P-type; and that volumetrically 90% of the bismuth telluride particles have an as measured equivalent-spherical-diameter less than 8.33 µm for the N-type and 10.99 µm for the P-type.

FIG. 8C is a table of cumulative number % less than indicated size for both P-type and N-type bismuth telluride thermoelectric semiconductor powders that have been and can be used for successful deposition using the cold-spray process of this disclosure. FIG. 8C shows the cumulative number % less than indicated size data for the same powder materials shown in FIG. 8B. Several assumptions must be made when using the volumetric percent data to calculate a cumulative number percent using this laser diffraction type particle size measurement technique, the number percent data is, therefore, simply representative of the fact that most of the particles in the mix made using the planetary ball milling process defined in FIG. 5 are significantly less than 1.0 µm in equivalent-spherical-dimension.

FIGS. 9A, 9B, 9C and 9D shows a set of photographs and tables displaying the effects of different volumetric particle size distributions of the thermoelectric semiconductor powders on the ability to successfully deposit P-type bismuth telluride thermoelectric semiconductor materials using the supersonic cold-spray process as disclosed.

FIG. 9A is an image of P-type bismuth telluride supersonic cold-spray deposition 903 using powder fabricated per FIG. 5 through Step 530. This powder had the measured volumetric particle size distributions of those listed in FIG. 9C. FIG. 9B is an image of P-type bismuth telluride cold spray deposition 905 using powder processed per FIG. 5 through Step 504 only and eliminating the remaining steps of the process. Using only the single high energy ball milling cycle of Step 504 resulted in the P-Type powder having generally larger particles with the measured volumetric particle size distributions of those listed in FIG. 9D, and those larger particles interfere with the successful deposition process; thus showing that using a mechanical milling process with sufficient milling time and milling intensity is critical to creating a powder with a specific maximum particle size and a volumetric size distribution that is necessary for a successful cold-spraying process.

FIG. 9C is a table of particle size data summary cumulative volume % less than indicated size for P-type bismuth telluride thermoelectric semiconductor powders that were used for successful deposition shown in FIG. 9A using the cold-spray process of this disclosure.

FIG. 9C shows the cumulative volume % less than indicated size where volumetrically 10% of the P-type particles have an equivalent spherical diameter of less than 0.62 µm, that volumetrically 50% of the P-type particles have equivalent spherical diameters less than 2.56 µm, and that volumetrically 90% of the P-type particles have equivalent spherical diameters less than 10.99 µm.

FIG. 9D is a table of particle size data summary cumulative volume % less than indicated size for P-type bismuth telluride thermoelectric semiconductor powders that were used for the surface cratered, unsuccessful cold-spray deposition shown in FIG. 9B.

FIG. 9D shows the cumulative volume % less than indicated size where volumetrically 10% of the P-type particles have an equivalent spherical diameter of less than 2.5 µm, that volumetrically 50% of the P-type particles have equivalent spherical diameters less than 13.3 µm, and that volumetrically 90% of the P-type particles have a spherical diameter less than 26.7 µm. The powder material for FIG. 9C used in the cold spray deposition shown in FIG. 9A, and the powder material for FIG. 9D used in the low quality cold spray deposition shown in FIG. 9B were made from material removed from the same billet of P-type bismuth telluride polycrystalline material by using the Across International planetary ball milling equipment and the generalized process steps as defined in FIG. 5. The powder material of FIG. 9C was subjected to the complete process as described in FIG. 5, through Step 530. The powder material of FIG. 9D was fabricated using the portions of the process described in FIG. 5 through Step 504, thus generating a semiconductor powder with larger particles that are still in the lower end of the size range normally used for cold-spray of metallic materials. Both depositions were made using the cold-spray nozzle design shown in FIG. 7 with nitrogen gas at an input temperature of 500 degrees C., and an input gas pressure of 0.7 MPa. All other test parameters such as powder feed method, nozzle standoff distance and substrate were identical. The results of FIG. 9A were achieved using a bismuth telluride powder with the cumulative volume distribution of FIG. 9C.

FIG. 9A shows a uniform, near theoretical density deposition 903 of the sprayed, P-type thermoelectric material was obtained using a bismuth telluride powder with the cumulative volume distribution of FIG. 9C. FIG. 9B, shows a porous, cratered and disrupted deposition 905 which demonstrates how the use of a powder with the cumulative volume distribution of FIG. 9D, with generally larger particles disrupts the cold spray deposition process. FIG. 9B demonstrates that any initial deposition that occurs is quickly cratered by the impact of particles above 15 µm in equivalent spherical diameter. These larger particles have sufficient energy on impact to effectively crater and then "sandblast" away any already deposited thermoelectric semiconductor material. Successful cold spraying, FIG. 9A of thermoelectric semiconductor and other crystalline materials requires particle sizes much smaller than the particle size distribution range normally used for metallic materials, which is one of the findings forming the basis of this disclosure.

Figure 10A:
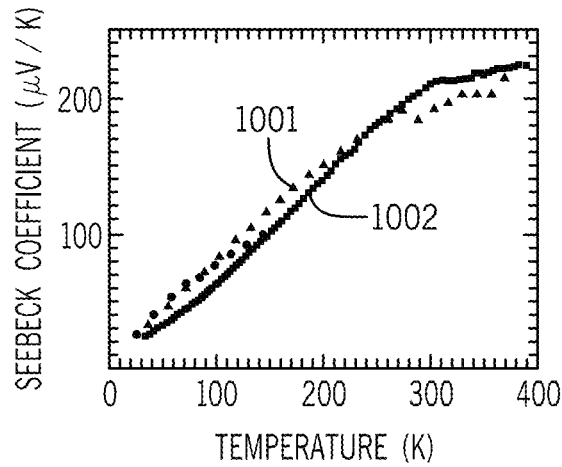
FIGS. 10A, 10B and 10C are graphs generated at Lawrence Livermore National Laboratory that demonstrate that cold sprayed thermoelectric semiconductor material prepared per the processes as defined in this disclosure retain their thermoelectric properties.
Figure 10B:
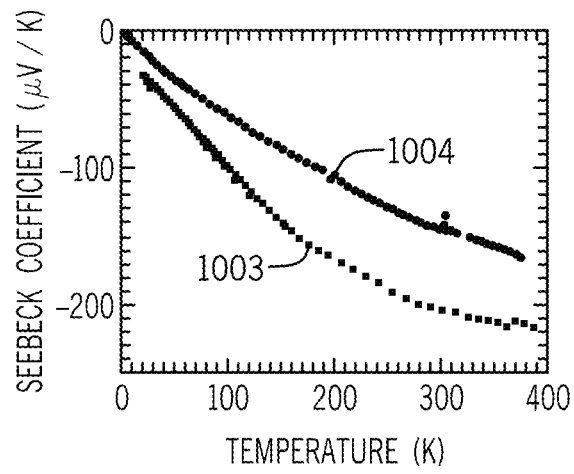
Figure 10C:
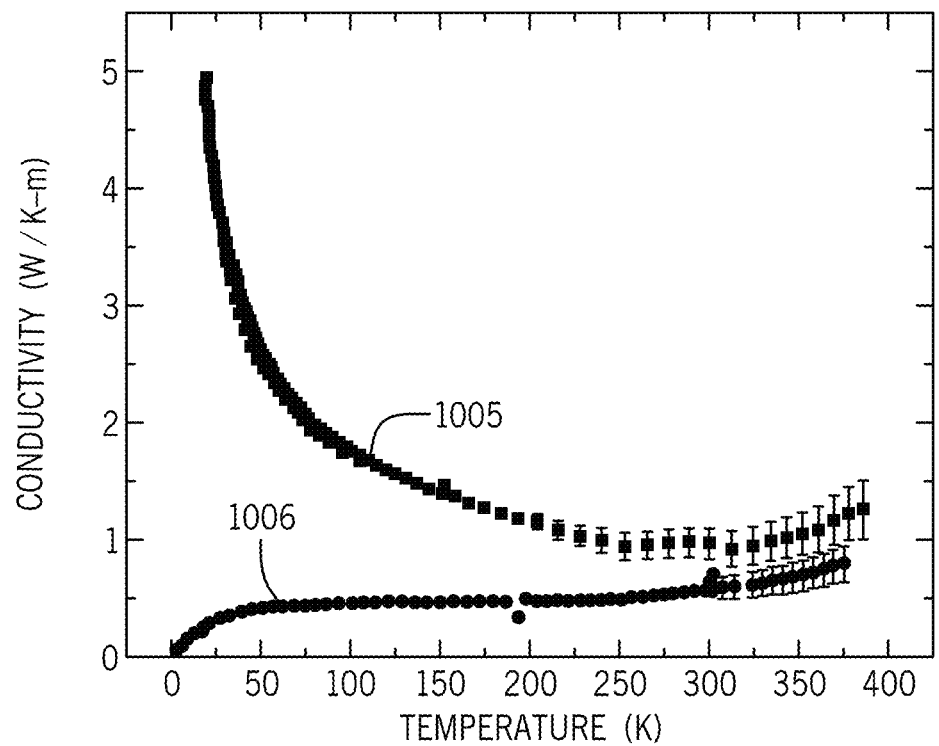

FIGS. 10A, 10B, and 10C show comparison graphs of thermoelectric property data generated at Lawrence Livermore National Laboratory on bismuth telluride samples taken from polycrystalline billets and supersonic cold-sprayed bismuth telluride materials which used the same polycrystalline billets to produce powders fabricated per the process of FIG. 5 of this disclosure.

FIG. 10A shows a comparison of the Seebeck coefficient over the range from 0-400 degrees Kelvin for cold sprayed bismuth telluride P-type material 1001 compared to P-type bismuth telluride material 1002 from an as manufactured polycrystalline billet. This data verifies that the cold sprayed P-type material retains the strong positive value Seebeck response of the precursor billet material.

FIG. 10B shows the comparison of the Seebeck coefficient versus temperature over the range from 0-400 degrees Kelvin between for cold sprayed bismuth telluride N-Type formulation 1004 compared to N-type bismuth telluride material 1003 from an as manufactured polycrystalline billet. The measured negative Seebeck response for the cold-sprayed N-type formulation 1004 is reduced compared to the values measured for the precursor billet material 1003 but still show a strong negative value Seebeck response. This data verifies that cold-sprayed N-type formulation 1004 material when manufactured per the processes defined in this disclosure retain or nearly retain the high µV/K response of the precursor billet material.

FIG. 10C is a graph of the measured thermal conductivity comparison between P-type bismuth telluride billet material 1005 and P-type supersonic cold-sprayed material 1006 showing that the cold-sprayed material has a beneficial lower thermal conductivity over the range from 50-400 degrees Kelvin. This lower thermal conductivity is beneficial in TEG applications where the peak hot side temperature is less than 400 degrees Kelvin.

Figure 11C:
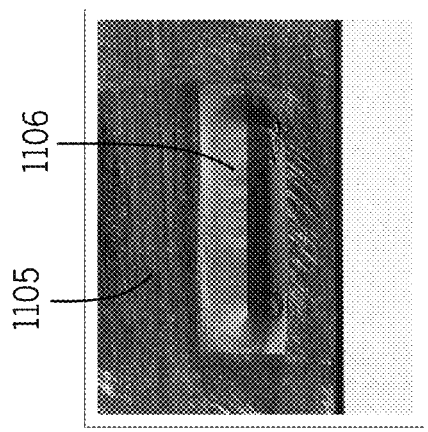
FIG. 11C is an image of a small section of 110-ETP alloy copper plate on which a supersonic cold-sprayed line of P-type bismuth telluride material has been deposited using the processes and equipment as described in the current disclosure.
Figure 11F:
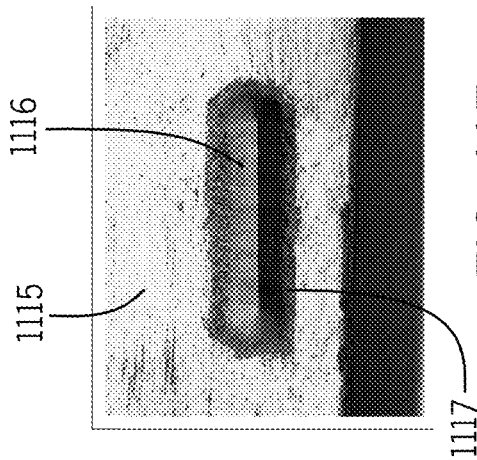
FIG. 11F is an image of a small section of an aluminum silicate ceramic material on which a supersonic cold-sprayed line of P-type bismuth telluride material has been deposited using the processes and equipment as described in the current disclosure.
Figure 11B:
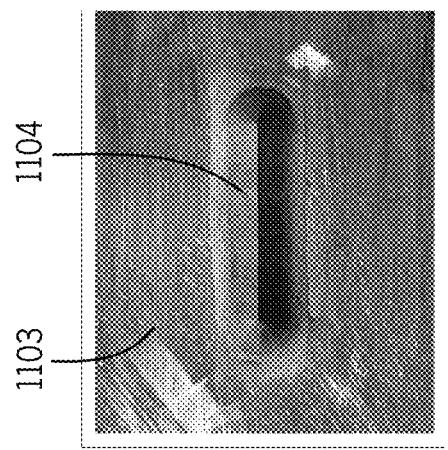
FIG. 11B is an image of a small section of 6061-T3 sheet aluminum on which a supersonic cold-sprayed line of P-type bismuth telluride material has been deposited using the processes and equipment as described in the current disclosure.
Figure 11E:
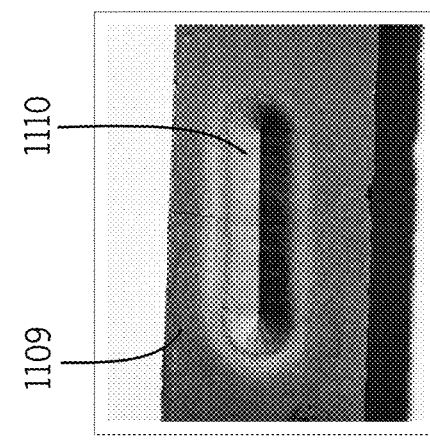
FIG. 11E is an image of a small section of a low-density syntactic high temperature silicone resin foam on which a supersonic cold-sprayed line of P-type bismuth telluride material has been deposited using the processes and equipment as described in the current disclosure.
Figure 11A:
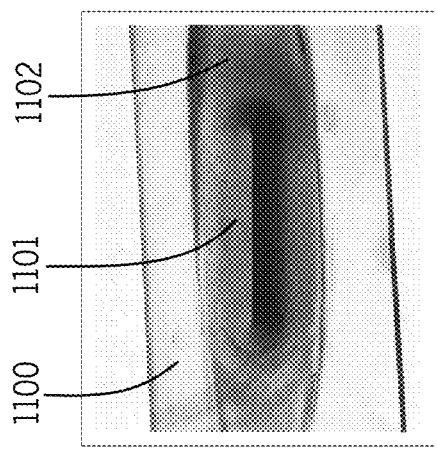
FIG. 11A is an image of a chemically etched glass slide on which a supersonic cold-sprayed line of P-type bismuth telluride has been deposited using the processes and equipment as described in the current disclosure.

FIG. 11A, FIG. 11B, FIG. 11C, FIG. 11D, FIG. 11E, and FIG. 11F show examples of various metals, glass, quartz, ceramic and silicone foam based materials that can be successfully used as the substrate material for the cold spray deposition of thermoelectric semiconductor materials FIG. 11A shows a chemically etched glass slide 1100 on which a supersonic cold-sprayed line 1101 of P-type bismuth telluride has been deposited using the processes and equipment described in this disclosure. The cold-spray process generates a light overspray coating 1102 on the substrate surface which can be eliminated by masking of the substrate surface prior to spraying or by removing the overspray later by machining. This process works equally well on a chemically etched glass or quartz substrate surfaces.

FIG. 11B shows P-type bismuth telluride material cold spray deposit 1104 on a small section of a 6061T3 aluminum substrate 1103.

FIG. 11C shows P-type bismuth telluride material cold-spray deposit 1106 on a small section of a 110-ETP alloy copper plate substrate 1105.

Figure 11D:
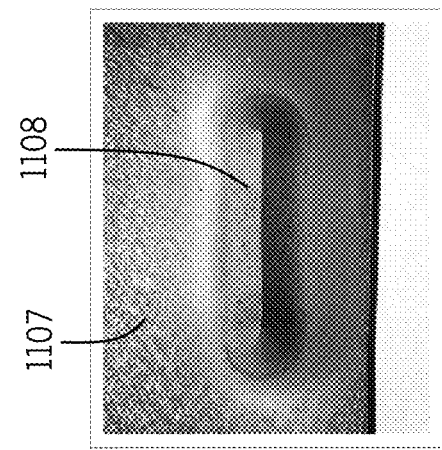
FIG. 11D is an image of a small section of sheet stainless steel on which a supersonic cold-sprayed line of P-type bismuth telluride material has been deposited using the processes and equipment as described in the current disclosure.

FIG. 11D shows P-type bismuth telluride material cold spray deposit 1108 on a small section of a 304 alloy, stainless steel substrate 1107.

FIG. 11E shows P-type bismuth telluride material cold-spray deposit 1110 on a low-density, 0.60 grams per cubic centimeter, syntactic high temperature capability silicone resin foam 1109.

FIG. 11F shows P-type bismuth telluride material cold spray deposit 1116 on a moderate density, 0.80 grams per cubic centimeter, aluminum silicate ceramic substrate 1115. A small amount of accumulated overspray material 1117 can be eliminated by prior masking of the surface or post cold spray deposition machining of the deposited thermoelectric semiconductor material.

Figure 12:
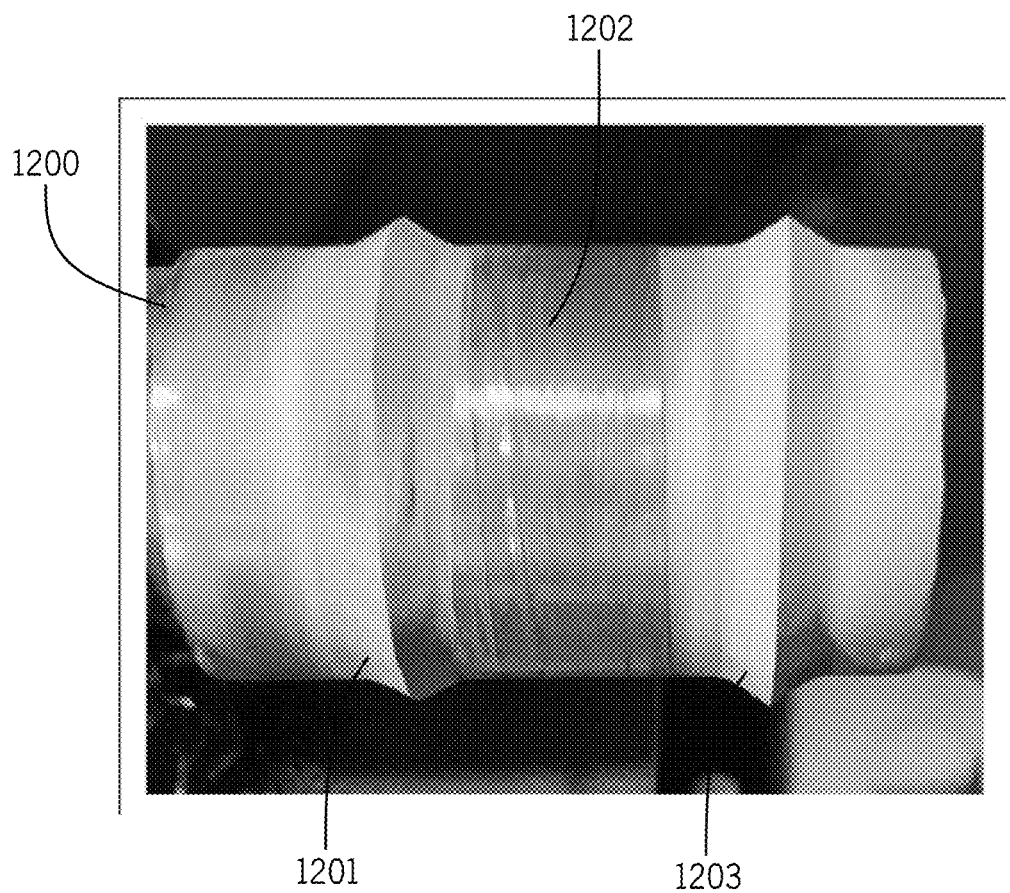
FIG. 12 is an image of a circular cross-section of a copper pipe with an N-type bismuth telluride cold-sprayed element and a P-type cold-sprayed bismuth telluride element demonstrating the ability to cold-spray deposit both N-type and P-type thermoelectric semiconductors on complex shaped surfaces using the processes and equipment as described in the current disclosure.

FIG. 12 is an image of supersonic cold-spray deposition of both N-type and P-type bismuth telluride thermoelectric semiconductors on a circular cross-section tube demonstrating the ability to cold-spray deposit thermoelectric semiconductors on complex shaped surfaces as described in this disclosure.

One of the specific benefits derived from an ability to supersonic cold spray thermoelectric semiconductor materials is that the methods and processes described in this disclosure enable the additive manufacturing of complete thermoelectric generators (TEGs) directly onto complex shaped thermal surfaces, such as pipes and other industrial process equipment. FIG. 12 shows how the processes disclosed can be used to deposit the thermoelectric elements required for a single thermoelectric thermocouple directly onto a copper pipe 1200, wherein a single N-type bismuth telluride cold-sprayed element 1201, and single P-type cold-sprayed bismuth telluride element 1203 being directly applied to the copper pipe 1200 with the area of the copper tube between the two elements 1202 protected by a Kapton® film. The disclosed cold-spray process can deposit small spots of material, annular rings or lines of material, as well as large area depositions. Multiple N-type and P-type elements can be deposited and then wired in series or parallel to produce the electrical output required These disclosed processes, when combined with existing cold spray processes and other established manufacturing processes, will enable the additive manufacturing of complete multi-thermocouple TEGs systems on to thermal sources of any shape and size. TEGs with just a few thermocouples can be fabricated which convert low grade heat from industrial sources to power Internet of Things (TOT) sensors, transmitters and other devices, as well as large area TEG systems with many thousands of thermocouples that can recover megawatts of energy from waste heat sources in the electricity generation, transportation, and industrial economic sectors of the U.S. and the world's economy. These processes also directly apply to Thermoelectric Cooler (TEC) systems application in all economic sectors. The methods and processes are not limited to thermoelectric semiconductor materials but also apply to a wide range of other crystalline functional materials.

Figure 13:
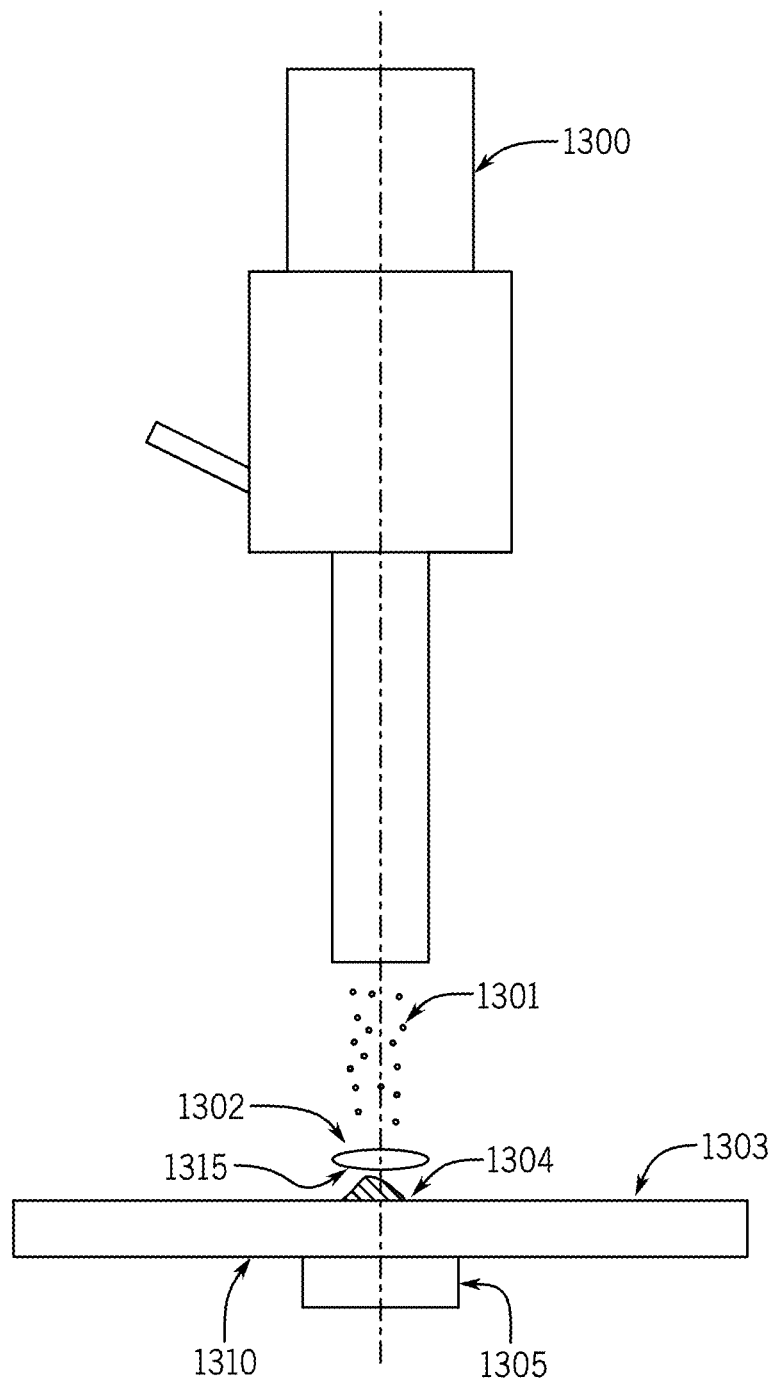
FIG. 13 is a diagram of an apparatus according to another embodiment of the present disclosure using high performance magnets to focus the cold sprayed thermoelectric semiconductor particles and improve the deposition.

Controlling the exact particle size range and the shape of the volumetric particle size distribution curve is difficult for thermoelectric semiconductor and other energy harvesting crystalline materials using a mechanical size reduction process such as high energy ball milling. The ball milling process used for thermoelectric semiconductor powders that can be successfully cold-sprayed can result in a large volumetric and numerical percentage of the material fabricated being in the nanometer size range. These very small particles may not gain sufficient energy during the cold spray process to reach the surface and interlock with the semiconductor material that has already been deposited. Those particles are instead swept away by the gas stream and either lost or need to be recovered and reprocessed for future use. FIG. 13 addresses one method for reducing this loss and shows another embodiment of the current disclosure whereby these particles are not lost, but can reach the surface with sufficient energy to adhere to the thermoelectric semiconductor material 1304.

FIG. 13 shows another embodiment of the current disclosure using high performance magnets to focus the cold sprayed thermoelectric semiconductor particles and improve the deposition. Nanometer sized, and very low micrometer sized thermoelectric semiconductor powders traveling at supersonic velocity can be influenced by strong magnetic fields. A cold spray nozzle with nozzle extension tube 1300 is nominally placed 1.5 cm above the substrate deposition surface 1303. Semiconductor particles 1301 that have been drawn into the gas stream exit the cold spray nozzle with nozzle extension tube 1300 traveling at supersonic velocity. Approximately 3-5 mm above the substrate deposition surface 1303 there is a bow shock 1302. As the semiconductor particles 1301 that have been drawn into the gas stream pass through the bow shock 1302, they exit into a region 1315 in which the gas velocity is subsonic. When smaller, 1 µm or less, particles encounter the bow shock they can be quickly decelerated and then swept away by the gas stream without adhering to the substrate deposition surface 1303 or to previously deposited material 1304. Placement of a high performance, neodymium type magnet 1305 with field strength in the range from 0.2-2 Tesla directly beneath an opposing side of the substrate deposition surface 1310 improves the thermoelectric semiconductor particle deposition on the substrate surface 1303 and to previously deposited material 1304 by focusing and attracting the semiconductor particles 1301 in the gas stream. The magnetic field aids in the smaller powder material particle reaching the surface with sufficient energy to adhere to the substrate deposition surface 1303 and/or the previously deposited 1304 material.

Either discrete magnetics (e.g., ceramic or rare earth magnets) or an energized field coil may be used, being placed beneath and opposing side of the substrate deposition surface 1310 and the central axis of the North and South poles of the magnet oriented co-linear with the axis of the cold-spray nozzle with nozzle extension tube 1300. Testing has shown that placing the North pole of the magnet oriented facing the opposing side of the substrate deposition surface 1310 when cold-spraying a P-type semiconductor, and the South pole of the magnet oriented facing the opposing side of the substrate deposition surface 1310 when cold-spraying an N-type semiconductor provides the greatest enhancement. Changes in the deposition efficiency of up to 20 percent have occurred by reversing the North/South Pole orientation of the magnetic field when spraying either an N-type or P-type material. Improvements to the deposition level by the addition of the magnetic field have been demonstrated in the range of 10-20 percent with field strengths as low as 0.1 Tesla. Higher field strengths from 0.2-2 Tesla further improve the deposition efficiency. Other magnetic field line orientations (fixed in a static orientation, or a controllably altered orientation) may also be used, for example to improve deposition-adhesion efficiency with respect to coverage of 3-dimensional structures that may have features that are "shadowed" with respect to a main spray direction.

A unique set of processes and equipment design considerations have been developed to enable the use of the supersonic cold-spray process in the deposition of non-malleable, brittle crystalline materials such as thermoelectric semiconductors. By judicious selection of the material particle size, the particle size distribution, and the cold spray system design and operating parameters, nanometer to very low micrometer size particles made from non-malleable, brittle crystalline materials can impact and wedge into a roughened surface and then mechanically interlock together to build up a polycrystalline material of near theoretical density without change to the material composition and structure.

The thermoelectric semi-conductor cold-spray processes described herein can be used in numerous energy harvesting systems for both terrestrial and space applications. The developed powder preparation and sizing process, when combined with specific cold spray nozzle design parameters and the specific set of cold spray equipment operational parameters allow the significant expansion of the use of TEG systems to produce electrical power from waste heat generated by transportation systems, industrial processes, and the energy producing sectors. The ability to cold-spray thin layers of thermoelectric semiconductor materials can maximize the power generated per unit area for certain applications, and the ability to cold-spray deposit these materials onto complex surfaces in any size and shaped configurations opens a much wider range of energy recovery applications for TEG systems as well as for energy sources for Internet of Things (IOT) sensors and transmitters.

In addition to thermoelectric generator applications, the processes developed are directly applicable for use in thermopile systems and for thermoelectric cooler applications.

The specific attributes of the cold spray process defined herein enables the additional potential for layering and incorporation of small quantities of specific figure of merit (ZT) enhancing materials within the powders to significantly increase the figure of merit of the sprayed thermoelectric material.

These processes developed for thermoelectric semiconductors such as bismuth telluride, antimony telluride and Tetrahedrite type materials also apply to the cold-spray deposition of a variety of other energy harvesting materials such as piezoelectric materials, other sensor type crystalline semi-conductor materials, and other polycrystalline functional materials.

Since the process can be used for a wide range of crystalline thermoelectric semiconductor materials it can also be used to deposit composite N-type and P-type elements where the thermoelectric material composition is changed throughout the deposition layer to enable the extraction of the maximum electrical energy from the thermal source by maintaining a high figure of merit over the full temperature range of the material from the hot side to the cold side of the thermoelectric generating device.

The invention claimed is:

1. A method of cold spray deposition of polycrystalline functional material particles onto a surface of a substrate, the method comprising:
feeding heated gas into a nozzle, the nozzle being a converging-diverging nozzle;
adding to the nozzle a polycrystalline functional material powder comprising particles with particle diameters in an inclusive range of 0.2 μm to 40 μm, With a majority of the particles having a particle diameter in an inclusive range of 0.2 μm to 15 μm;
mixing the polycrystalline functional material powder with the heated gas in the nozzle, particles of the polycrystalline functional material being brittle and having a functional property;
emitting a mixture of the heated gas and polycrystalline functional material powder from the nozzle at a supersonic velocity toward the substrate; and
coating at least a portion of the surface of the substrate that receives the particles of the polycrystalline functional material emitted from the nozzle while maintaining the functional property of the particles, wherein the coating step includes adhering the particles to one another.

2. The method of claim 1, wherein the mixing includes adding hollow microsphere particles to the mixture.

3. The method of claim 2, wherein the hollow microsphere particles include glass particles.

4. The method of claim 1 wherein the polycrystalline functional material includes at least one of a N-type semiconductor material and a P-type semiconductor material.

5. The method of claim 1, wherein the polycrystalline functional material includes a piezoelectric material.

6. The method of claim 1, wherein the gas being nitrogen, helium or a gaseous mixture that includes at least one of nitrogen and helium.

7. The method of claim 1, further comprising pressurizing the gas to a pressure in an inclusive range of 0.5 MPa through 0.9 MPa.

8. The method of claim 1, further comprising heating a gas to become the heated gas at a temperature in an inclusive range of 300 degrees centigrade through 550 degrees centigrade.

9. The method of claim 1, wherein the nozzle has a convergence to divergence length ratio in an inclusive range of 1 through 3.

10. The method of claim 1 wherein a diameter of a throat of the nozzle is 1.5 mm and a diameter of a powder entrance tube of the nozzle is 1.5 mm.

11. The method of claim 1, wherein the polycrystalline functional material includes a thermoelectric semiconductor material.

12. The method of claim 11, wherein the thermoelectric semiconductor material includes at least one of bismuth telluride, antimony telluride, or Tetrahedrite type copper sulfosalts.

13. The method of claim 11, further comprising repeating the adding, mixing, emitting, and coating steps with another powder to form a different layer of material deposited on top of a first thermoelectric semiconductor layer of material deposited on the surface of the substrate.

14. The method of claim 13, wherein the first thermoelectric semiconductor layer and the different layer both comprising N-type semiconductor materials, or both comprising P-type semiconductor materials.

15. The method of claim 1, further comprising applying a magnetic field to the mixture while the mixture moves from the nozzle to the substrate.

16. The method of claim 15, wherein the applying includes applying the magnetic field with a magnet disposed on an opposite side of the substrate from the nozzle.

17. The method of claim 1, wherein the nozzle has a nozzle expansion area ratio in an inclusive range of 7 to 13.

18. The method of claim 17, wherein the nozzle has the nozzle expansion ratio of about 10.

19. A method of making a functional material powder for use in a cold spray process, the method of making comprising:
mechanically reducing a diameter size of particles in the functional material powder to be in an inclusive range of 0.2 μm to 40 μm, with a majority of the particles being in an inclusive range of 0.2 μm to 15 μm, the particles being brittle and having a functional property;
applying the particles to a ball mill with alcohol;
drying the particles;

storing dried particles having a diameter in the inclusive range of 0.2 μm to 40 μm, with a majority of the particles being in the inclusive range of 0.2 μm to 15 μm; and coating a surface of a substrate by emitting the particles from a nozzle at a supersonic velocity and adhering the particles to one another.

20. A cold-spray deposition nozzle comprising:

a gas feed that receives a heated gas into the cold-spray deposition nozzle;

a convergent-divergent nozzle comprising a convergent portion that is open at one end thereof to receive the heated gas from the gas feed and a narrower opposite end, a throat that receives the heated gas from the narrower opposite end of the convergent portion, a divergent portion that has a first end which receives the heated gas from the throat, the divergent portion tapering from the first end to a larger second end through which a mixture of the heated gas and functional material powder of particle diameter sizes in an inclusive range of 0.2 μm to 40 μm are emitted, and an input port that communicates with an interior of the divergent portion and through which the functional material powder is input so as to mix with the heated gas in the divergent portion prior to being emitted from the cold-spray deposition nozzle through the larger second end of the divergent portion, wherein the nozzle has a nozzle expansion area ratio in an inclusive range of 7 to 13, a diameter of the throat is 1.5 mm, and a diameter of the powder entrance tube is 1.5 mm, and the convergent-divergent nozzle is configured to emit particles of the functional material powder at a supersonic speed so as to form a coating of the particles that adhere to one another on a portion of a surface of a substrate, the particles being brittle.

* * * * *